(12) United States Patent
Peck et al.

(10) Patent No.: US 7,945,894 B2
(45) Date of Patent: May 17, 2011

(54) IMPLEMENTING A DESIGN FLOW FOR A PROGRAMMABLE HARDWARE ELEMENT COUPLED TO A PROCESSOR

(75) Inventors: Joseph E. Peck, Hutto, TX (US); Hugo A. Andrade, Austin, TX (US)

(73) Assignee: National Instruments Corporation, Austin, TX (US)

( * ) Notice: Subject to any disclaimer, the term of this patent is extended or adjusted under 35 U.S.C. 154(b) by 1197 days.

(21) Appl. No.: 11/566,941

(22) Filed: Dec. 5, 2006

(65) Prior Publication Data

US 2007/0129819 A1 Jun. 7, 2007

Related U.S. Application Data

(60) Provisional application No. 60/742,318, filed on Dec. 5, 2005.

(51) Int. Cl.
G06F 9/44 (2006.01)
G06F 3/00 (2006.01)
G06F 3/033 (2006.01)

(52) U.S. Cl. ........ 717/109; 717/112; 717/113; 717/121; 715/736; 715/740; 715/854

(58) Field of Classification Search .......................... None
See application file for complete search history.

(56) References Cited

U.S. PATENT DOCUMENTS

| | | | |
|---|---|---|---|
| 5,832,270 | A | 11/1998 | Laffra et al. |
| 6,189,142 | B1 | 2/2001 | Johnston et al. |
| 6,199,199 | B1 | 3/2001 | Johnston et al. |
| 6,219,628 | B1 | 4/2001 | Kodosky et al. |
| 6,438,512 | B1 | 8/2002 | Miller |

(Continued)

FOREIGN PATENT DOCUMENTS

WO 00/38087 6/2000

OTHER PUBLICATIONS

International Search Report and Written Opinion for Application No. PCT/US2006/061616 mailed Jul. 11, 2007.

(Continued)

*Primary Examiner* — Tuan Q Dam
*Assistant Examiner* — Isaac T Tecklu
(74) *Attorney, Agent, or Firm* — Meyertons Hood Kivlin Kowert & Goetzel, P.C.; Jeffrey C. Hood; Mark S. Williams

(57) ABSTRACT

System and method for implementing a design flow for a programmable hardware element (PHE) coupled to a processor. A graphical program (GP) that specifies performance criteria is received. The GP is mapped for deployment, with a first portion targeted for execution by the processor, and a second portion targeted for implementation in the PHE. A determination is made as to whether the graphical program meets the performance criteria. If not, the GP is remapped for deployment, including identifying and specifying the sub-portion for implementation in the PHE, thereby moving the sub-portion from the first portion to the second portion, and/or identifying and specifying the sub-portion for execution on the processor, thereby moving the sub-portion from the second portion to the first portion. The determining and remapping are repeated until the performance criteria are met. The first and second portions are deployed to the processor and the PHE, respectively.

39 Claims, 13 Drawing Sheets

U.S. PATENT DOCUMENTS

| | | | |
|---|---|---|---|
| 6,557,167 | B1 | 4/2003 | Thelen |
| 6,591,225 | B1 | 7/2003 | Adelman et al. |
| 6,694,507 | B2 | 2/2004 | Arnold et al. |
| 6,807,575 | B1 | 10/2004 | Emaru et al. |
| 2001/0025231 | A1 | 9/2001 | Kodosky et al. |
| 2003/0038842 | A1 | 2/2003 | Peck et al. |
| 2005/0034106 | A1* | 2/2005 | Kornerup et al. ............ 717/132 |
| 2005/0144523 | A1* | 6/2005 | Sierer et al. ................... 714/25 |
| 2006/0117302 | A1* | 6/2006 | Mercer et al. ................ 717/131 |
| 2007/0168943 | A1* | 7/2007 | Marini et al. ................ 717/108 |
| 2010/0058296 | A1* | 3/2010 | Nattinger ..................... 717/125 |

OTHER PUBLICATIONS

Ye, W., et al., "Fast Timing Analysis for Hardware-Software Co-Synthesis". 1993 Computer Design: VLSI in Computers and Processors. ICCD '93. Proceedings, 1993 IEEE International Conference in Cambridge, MA, Oct. 3-6, 1993, Oct. 3, 1993, pp. 452-457, Los Alamitos, CA, USA.

Parkinson, M. F., et al. "Profiling in the ASP Codesign Environment". 1995 System Synthesis, Proceedings of the Eighth International Symposium in Cannes, France, Sep. 13-15, 1995. Sep. 13, 1995, pp. 128-133, Los Alamitos, CA, USA.

Knieser, M.J., et al. "Comet: A Hardware-Software Codesign Methodology". Proceedings of Euro-DAC '96 European Design Automation Conference with Euro-VDL '96 and Exhibition, Geneva, Sep. 16-20, 1996. Proceedings of Euro-DAC, European Design Automation Conference with Euro-VDL and Exhibition, Sep. 16, 1996, pp. 178-183, Los Alamitos, CA, USA.

Edwards, M.D., et al. "Software acceleration using programmable hardware devices", IEEE Proceedings: Computers and Digital Techniques, IEEE, GB, Jan. 25, 1996, pp. 55-63, vol. 143, No. 1.

U.S. Appl. No. 11/566,962, entitled "Implementing a Design Flow for a Programmable Hardware Element That Includes a Processor", by Hugo A. Andrade and Joseph E. Peck, filed Dec. 5, 2006; 82 pages.

Farzad Zarrinfar, Bill Salefski, and Stephen Simon; "Increase Performance and Lower Cost Through System Design"; Apr. 18, 2005; 3 pages; Xcell Journal Online—Poseidon article—Issue 53; Xilinx, Inc.

Chris Sullivan and Milan Saini; "Software-Complied System Design Opimizes Xilinx Programmable Systems"; May 2, 2003; 6 pages; Xcell Journal Online—Celoxica article; Xilinx, Inc.

Ahmad Ansari, Peter Ryser, and Dan Isaacs; "Accelerated System Performance with APU-Enhanced Processing"; Embedded magazine; Mar. 2005; pp. 10-13.

"Quartus II Software Release Notes"; Jul. 2005; pp. 1-48; Altera Corporation.

* cited by examiner

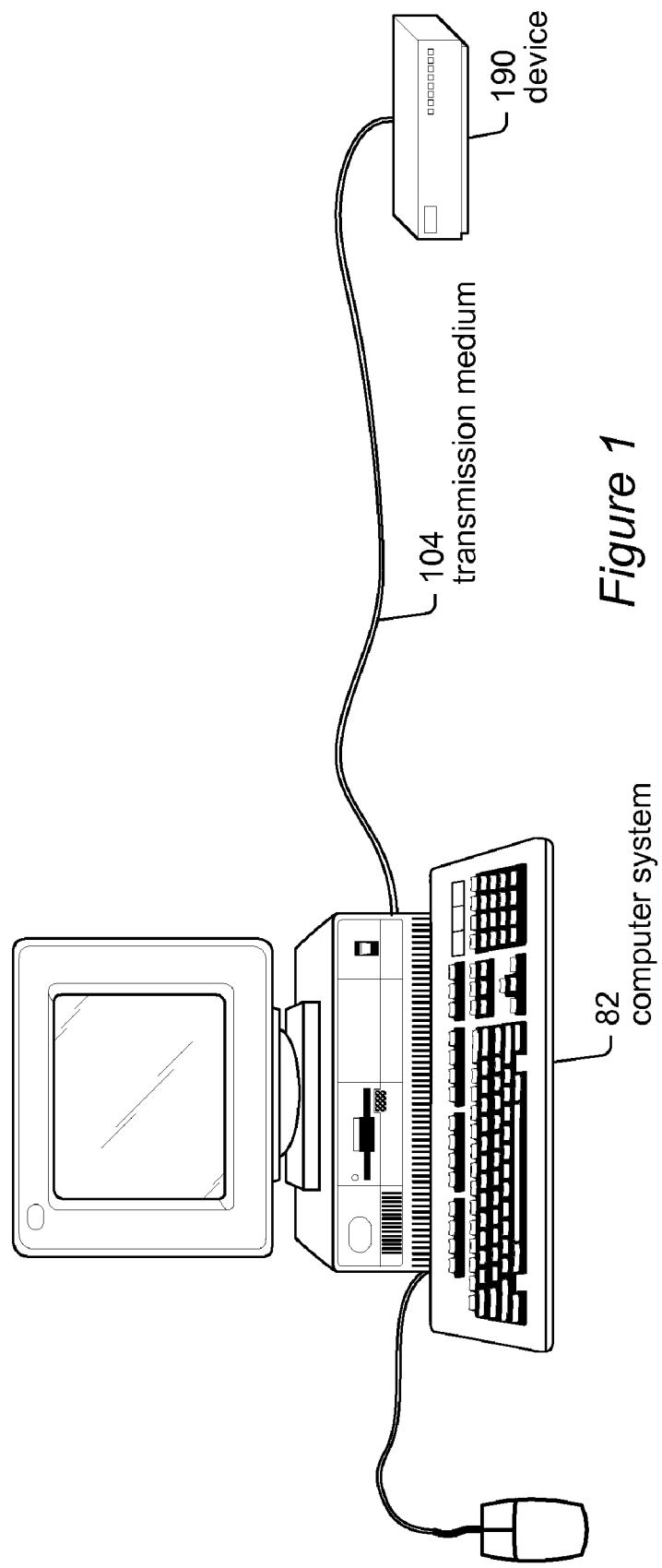

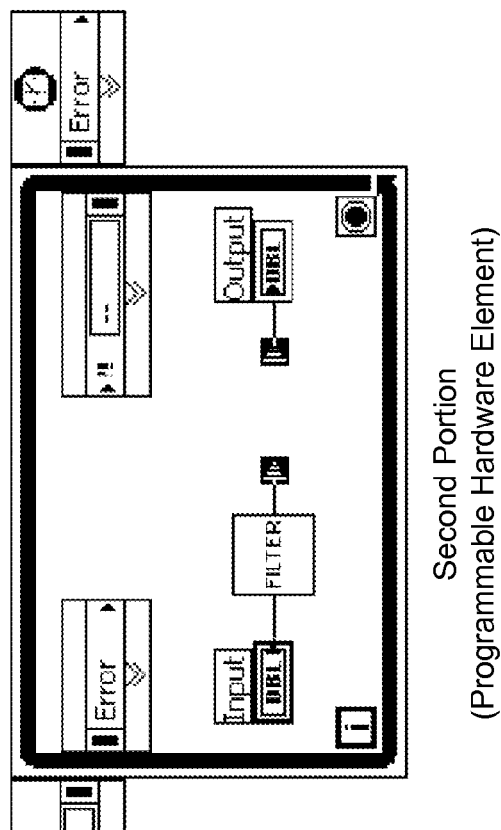
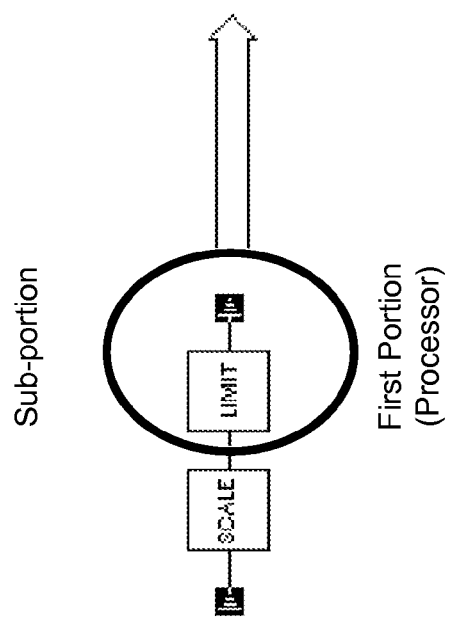
Figure 8B

IMPLEMENTING A DESIGN FLOW FOR A PROGRAMMABLE HARDWARE ELEMENT COUPLED TO A PROCESSOR

PRIORITY DATA

This application claims benefit of priority of U.S. Provisional Application 60/742,318, titled "Graphical Method Implementing a Design Flow in a Processor Centric FPGA System", filed Dec. 5, 2005, whose inventors are Hugo A. Andrade and Joseph E. Peck, and which is incorporated by reference in its entirety as though fully and completely set forth herein.

FIELD OF THE INVENTION

The present invention relates to the field of graphical programming, and more particularly to a system and method for implementing a processor centric system design flow for a programmable hardware element that implements, e.g., is configured with or includes, a processor, or that is coupled to a processor.

DESCRIPTION OF THE RELATED ART

Programmable hardware elements, such as Field Programmable Gate Arrays (FPGAs), continue to increase in density and capability, and are now capable of implementing true systems-on-chip, where not only fabric (reprogrammable) elements are available but also dedicated resources such as hardware multipliers, DSP processing blocks, large memories, Ethernet MACs and hardware processors. Implementing processor-based systems with programmable hardware elements has become a relatively common and simple task. The processor system can be built from dedicated hardware resources or built out of the fabric itself. This duality provides a very powerful tradeoff opportunity.

Recently, several companies (including, but not limited to, Celoxica, Poseidon System Design, Impulse Accelerated Technologies, Xilinx and Altera) have announced tools or plans for tools to provide support for the beginnings of what may be called processor-centric flows. In designing these flows a designer generally starts with a small programmable hardware element, e.g., FPGA, based processor and a set of (textual, e.g., C) source code files to implement. The given source code (compiled for the given processor system) is first profiled, and portions of the code that need to be accelerated to meet a specified performance level are identified. These portions are then implemented as a hardware configuration on the programmable hardware element, e.g., via a hardware configuration program deployed to the programmable hardware element. When the system executes, the processor (implemented on the programmable hardware element) executes those portions of the source code (after compilation, of course) not implemented as hardware on the FPGA in conjunction with the hardware-implemented portions (on the FPGA).

In many types of applications, e.g., real time control and automation systems, timing and I/O constraints may be important aspects of the system performance, e.g., may be as important as overall execution time. However, text-based programming languages such as C do not generally support precise specification and control of performance criteria, such as timing in programs, or I/O constraints.

Thus, improved systems and methods for specifying, designing and implementing processor centric flows are desired.

SUMMARY OF THE INVENTION

Various embodiments of a system and method for specifying and implementing a processor-centric system design flow are presented. It should be noted that the description below is directed to embodiments of two primary novel conceptions that are similar but distinct; specifically: embodiments where the processor is intrinsic to the programmable hardware element, i.e., is implemented in the programmable hardware element, e.g., via configuration of the fabric (e.g., the logic gates) of the programmable hardware element, or manufacture, i.e., built directly in and as part of the programmable hardware element; and embodiments where the processor is extrinsic to the programmable hardware element, i.e., is coupled to the programmable hardware element, e.g., where the processor is external to or not part of the programmable hardware element itself. Note that where the description is applicable to both conceptions, generic language may be used; and that where the two conceptions diverge, distinguishing terminology will be used to indicate the distinctions, e.g., via reference to intrinsic and extrinsic embodiments of the invention.

First, a graphical program may be received, e.g., stored in a computer accessible memory medium. In preferred embodiments, the graphical program includes performance criteria, e.g., resource use, timing, and/or I/O constraint information, among others, specifying desired, e.g., minimum, performance characteristics for the graphical program. The graphical program includes a plurality of interconnected nodes that visually indicate functionality of the graphical program, including a first portion targeted for execution by a processor implemented on a programmable hardware element, and a second portion targeted for implementation on the programmable hardware element. Note that in some embodiments, the processor may include multiple processors, and/or the programmable hardware element may include multiple programmable hardware elements, or may include various parts or regions that are managed or targeted separately. Thus, these (first and second) portions may include or be further partitioned into first and/or second sub-portions, respectively, for execution by these processors and for implementation on these parts or regions (e.g., of the programmable hardware element fabric). Thus, for example, in some embodiments, respective sub-portions of the graphical program may be targeted for deployment to an arbitrary number of computing elements, where these computing elements may be processors and/or programmable hardware element parts. Note that in various embodiments, the graphical program may comprise one or more of: a graphical data flow, control flow, and/or execution flow program, or, in one embodiment, a graphical system diagram.

In one embodiment, the method may include receiving user input specifying the graphical program, e.g., on a computer system, e.g., using a graphical program editor. The graphical program may comprise a plurality of interconnected nodes or icons that visually indicates the functionality of the program. In some embodiments, the graphical program may comprise a block diagram and may also include a user interface portion or front panel portion. Where the graphical program includes a user interface portion, the user may optionally assemble the user interface on the display.

As one example, the user may use a graphical program development environment to create the graphical program, such as, for example, the LabVIEW™ graphical program development system provided by National Instruments Corporation, which uses the "G" graphical programming language. For example, a graphical system design environment may include a combination of the LabVIEW, LabVIEW FPGA, and LabVIEW Embedded, which may collectively be capable of targeting different processing engine types found in modern programmable hardware elements, such as fabric (of an FPGA), processors, and/or other programmable components. The environment preferably has full parallel semantics, such that, for example, parallel loops in the graphical program may actually specify functionalities that may compete for given resources from the different loops. This resource contention may be taken into account in computing the requirements for implementation in hardware. Note that such graphical tools may offer a much richer set of specification mechanisms than existing text based languages generally do, and therefore may provide the end-user tools necessary to at least partially automate development of a processor centric flow.

The graphical program may be mapped for deployment. In embodiments of the first conception of the invention, in such a mapping, a first portion of the graphical program may be targeted for execution by a processor implemented in a programmable hardware element, and a second portion may be targeted for implementation in the programmable hardware element. Thus, as noted above, in embodiments of this first conception, the processor is intrinsic to the programmable hardware element, i.e., via configuration of the programmable hardware element, or by direct manufacture of the processor in the programmable hardware element. Alternatively, in embodiments of the second conception of the invention, in the mapping, the first portion of the graphical program may be targeted for execution by a processor coupled to the programmable hardware element, and the second portion may be targeted for implementation in the programmable hardware element. Thus, as also noted above, in embodiments of this second conception, the processor is extrinsic to the programmable hardware element, i.e., is coupled or connected to the programmable hardware element, rather than being configured in or manufactured as part of the programmable hardware element.

A determination may be made as to whether the graphical program meets the performance criteria, e.g., the performance, timing, and/or I/O constraints criteria. In other words, a determination may be made as to whether the graphical program meets the performance criteria when executed according to the above mapping, i.e., when executed on the respective targets, i.e., the first portion by the processor and the second portion implemented in the programmable hardware element.

For example, in one embodiment, the graphical program may be profiled, e.g., using a profiler and/or any of various other tools, as desired. Note that in some embodiments, the determining may be performed during edit time of the graphical program, which may facilitate rapid iteration of the system, since the user can simply edit or otherwise modify the graphical program (or portions) directly and easily, e.g., without having to wait for lengthy compile cycles. Alternatively, or in addition, the determining may be performed during compile time, simulation or emulation. In some embodiments, the determining may be performed at run time, e.g., after the graphical program (portions) have been deployed to the programmable hardware element, although this approach may be less efficient than the above approaches. Further details of this determining process are provided below.

If the graphical program meets all the performance criteria, e.g., if the result of the determining, e.g., profiling, etc., proves that the graphical program satisfies the performance criteria, then the development may be considered complete. However, if the performance criteria are not met, the method may proceed as described below.

If the graphical program is determined to not meet the performance criteria, the graphical program may be remapped for deployment. For example, in some embodiments, the remapping may include identifying a sub-portion included in the first portion of the graphical program, and specifying the sub-portion for implementation in the programmable hardware element, thereby moving the sub-portion from the first portion of the graphical program to the second portion of the graphical program, and/or identifying a sub-portion included in the second portion of the graphical program, and specifying the sub-portion for execution on the processor, thereby moving the sub-portion from the second portion of the graphical program to the first portion of the graphical program. In other words, the remapping may identify one or more sub-portions of the first and/or second portions of the graphical program for respective movement to the second and/or first portions of the graphical program, respectively, thereby retargeting the sub-portions for implementation in the programmable hardware element and/or execution by the processor, respectively.

Thus, for example, in a case where a sub-portion of the first portion of the graphical program is identified, e.g., due to slow performance by the processor, the sub-portion may be specified, i.e., re-targeted, for implementation in the programmable hardware element, thereby (presumably) increasing the expected performance of the graphical program. Similarly, in a case where a sub-portion of the second portion of the graphical program is identified, e.g., due to excessive resource use (e.g., too much area of the programmable hardware element being consumed), the sub-portion may be specified, i.e., re-targeted, for execution by the processor, thereby increasing the expected performance of the graphical program (with respect to resource consumption). Note that such retargeting may generally involve some type of tradeoff between different performance metrics, e.g., between execution time performance and resource utilization or area consumption of the programmable hardware element. Thus, in some embodiments, the overall performance criteria may be a complex or compound metric, possibly with competing components.

The determining and remapping may be performed one or more times in an iterative manner, until the performance criteria are met, or until it is determined that the graphical program simply cannot meet the performance criteria, e.g., no matter how the program is partitioned. It should be noted that the mapping and iteration conditions do not have to be based on full compilations of the program, but may be performed based on high level estimates of performance with respect to the target or targets.

After a number of such iterations (e.g., source code edits and/or redirection of source code for implementation on the programmable hardware element), a hardware-software partition may be found that meets the performance criteria, and that can endure small perturbations of the high-level source code without having to recompile the hardware portions. In other words, further modifications to the graphical program may primarily iterate on the software portions that are substantially faster to compile. In preferred embodiments, the method may also include deploying the graphical program, including deploying the first portion of the graphical program for execution on the processor, and deploying the second portion of the graphical program to the programmable hardware element, and executing the graphical program, including executing the first portion of the graphical program on the processor, and executing the second portion of the graphical program on the programmable hardware element. In some embodiments, the deploying and/or executing may be performed one or more times.

Thus, during performance of the method, the compilation and/or deployment (and possibly execution) may be performed in an iterative manner until the deployed graphical program meets the specified performance criteria. Once the (partitioned) graphical program meets the performance criteria, the graphical program may be deployed for execution by or on the processor and programmable hardware element. The graphical program may be executed, where the first portion of the graphical program is executed by the processor (implemented in or coupled to the programmable hardware element), and the second portion of the graphical program (implemented on the programmable hardware element) is executed by the programmable hardware element.

BRIEF DESCRIPTION OF THE DRAWINGS

A better understanding of the present invention can be obtained when the following detailed description of the preferred embodiment is considered in conjunction with the following drawings, in which:

FIG. 1 illustrates a system for developing a processor-centric flow, according to an embodiment of the present invention;

FIGS. 8A-8C illustrate exemplary mapping and remapping of a graphical program into a first portion targeted for execution by a processor, and a second portion targeted for implementation in a programmable hardware element, according to one embodiment.

Figure 2A:
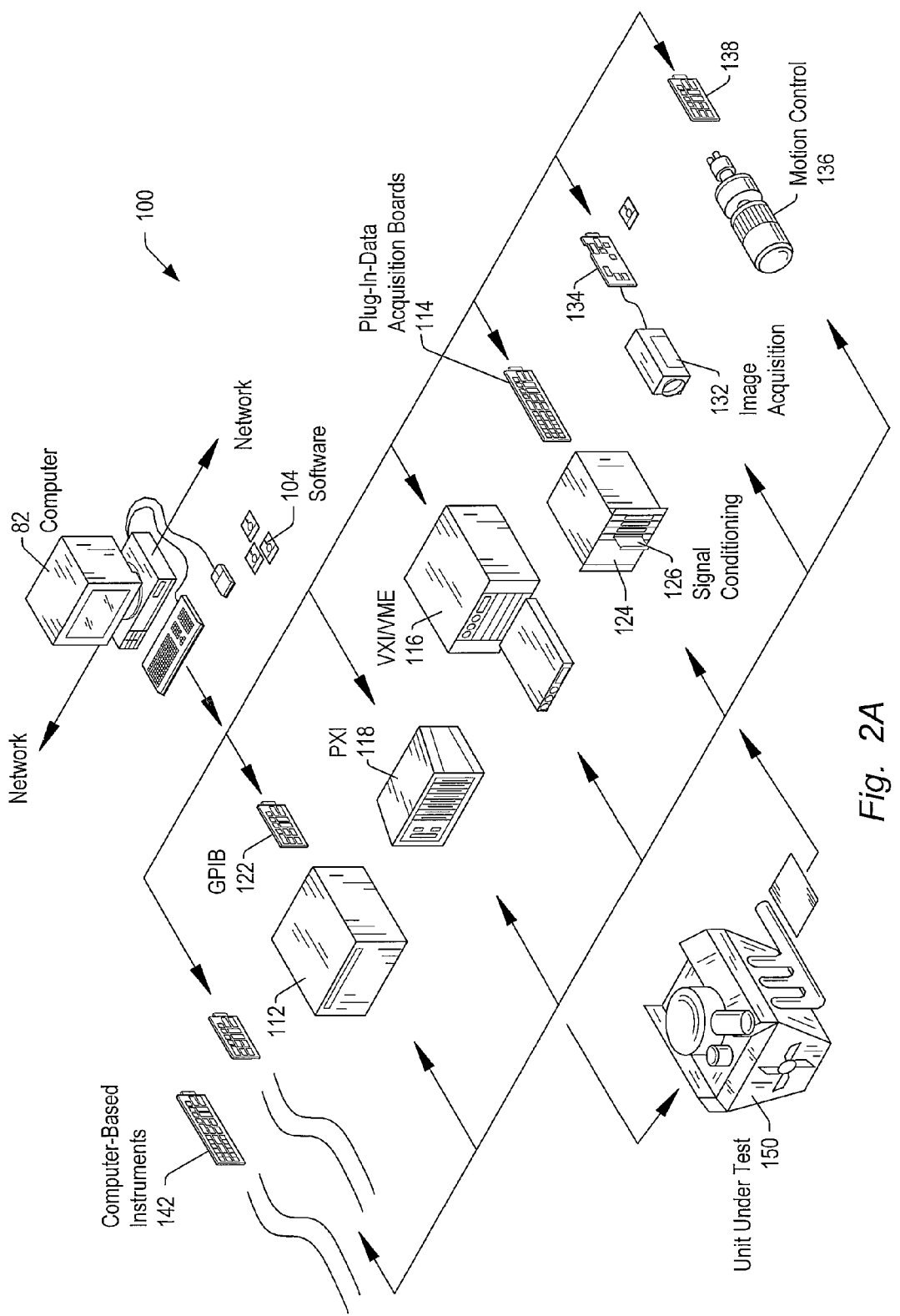
FIG. 2A illustrates an instrumentation control system, according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 6,173,438 titled "Embedded Graphical Programming System", filed Aug. 18, 1997.

U.S. Pat. No. 7,042,469 titled "Multiple Views for a Measurement System Diagram", filed Dec. 23, 2002.

U.S. Pat. No. 7,062,718 titled "Configuration Diagram Which Graphically Displays Program Relationship", filed Apr. 1, 2002.

U.S. Patent Application Publication No. 20010020291 (Ser. No. 09/745,023) titled "System and Method for Programmatically Generating a Graphical Program in Response to Program Information," filed Dec. 20, 2000.

U.S. patent application Ser. No. 10/635,078 titled "Emulation of a Programmable Hardware Element," filed Aug. 6, 2003.

U.S. patent application Ser. No. 10/892,829 titled "A Graphical Program Which Executes a Timed Loop," filed Jul. 16, 2004.

U.S. patent application Ser. No. 11/204,286 titled "Timed Sequence Structure for a Graphical Program," filed Aug. 15, 2005.

U.S. patent application Ser. No. 11/204,779 titled "Synchronizing Execution of Graphical Programs Executing on Different Computer Systems," filed Aug. 16, 2005.

U.S. patent application Ser. No. 10/361,661 titled "Parameter-Oriented Graphical Representation of Hardware Timing and Triggering Capabilities with Contextual Information," filed Feb. 10, 2003.

U.S. patent application Ser. No. 09/747,091 titled "System and Method for Programmatically Generating a Graphical Program in Response to a State Diagram", filed Dec. 21, 2000.

U.S. patent application Ser. No. 10/869,572 titled "Graphical Data Flow Programming Environment with First Model of Computation that Includes a Structure Supporting Second Model of Computation", filed Jun. 16, 2004.

U.S. patent application Ser. No. 10/869,656 titled "Creating and Executing a Graphical Program with First Model of Computation that Includes a Structure Supporting a Second Model of Computation", filed Jun. 16, 2004.

U.S. patent application Ser. No. 10/978,995 titled "System and Method for Programmatically Generating a Second Graphical Program Based on a First Graphical Program", filed, Nov. 1, 2004.

U.S. patent application Ser. No. 10/283,548 titled "Deployment and Execution of a Program on an Embedded Device", filed, Oct. 30, 2002.

U.S. patent application Ser. No. 10/113,987 titled "A Configuration Diagram Which Displays a Configuration of a System", filed, Apr. 1, 2002.

U.S. patent application Ser. No. 10/176,739 titled "Configuration Diagram with Context Sensitive Connectivity", filed, Jun. 21, 2002.

U.S. patent application Ser. No. 10/176,726 titled "Graphically Configuring Program Invocation Relationships by Creating or Modifying Links Among Program Icons in a Configuration Diagram", filed, Jun. 21, 2002.

U.S. patent application Ser. No. 10/869,656 titled "Creating and Executing a Graphical Program with First Model of Computation that Includes a Structure Supporting a Second Model of Computation", filed, Jun. 16, 2004.

U.S. patent application Ser. No. 10/869,572 titled "Graphical Data Flow Programming Environment with First Model of Computation that Includes a Structure Supporting Second Model of Computation", filed, Jun. 16, 2004.

TERMS

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected blocks or icons, wherein the plurality of interconnected blocks or icons visually indicate functionality of the program.

The following provides examples of various aspects of graphical programs. The following examples and discussion are not intended to limit the above definition of graphical program, but rather provide examples of what the term "graphical program" encompasses:

The blocks in a graphical program may be connected in one or more of a data flow, control flow, and/or execution flow format. The blocks may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink®from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), VisiDAQ™ from Advantech, System Generator for DSP from Xilinx, Inc., and DSP Builder from Altera Corporation, among others.

The term "graphical program" includes models or block diagrams created in graphical modeling environments, wherein the model or block diagram comprises interconnected blocks or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks are often referred to as the block diagram portion of the graphical program.

Block—In the context of a graphical program, an element that may be included in a graphical program. A block may have an associated icon that represents the block in the graphical program, as well as underlying code or data that implements functionality of the block. Exemplary blocks include function blocks, sub-program blocks, terminal blocks, structure blocks, etc. Blocks may be connected together in a graphical program by connection icons or wires.

The blocks in a graphical program may also be referred to as graphical program nodes or simply nodes (not to be confused with the nodes that connect components in a circuit diagram).

Graphical Data Flow Program (or Graphical Data Flow Diagram)—A graphical program or diagram comprising a plurality of interconnected blocks, wherein at least a subset of the connections among the blocks visually indicate that data produced by one block is used by another block. A LabVIEW VI is one example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input the by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

FIG. 1—Computer System

FIG. 1 illustrates a system configured to implement some embodiments of the present invention. Various embodiments of a method for implementing a processor centric system design flow are described below.

As FIG. 1 shows, in some embodiments, a computer system 82 may be coupled to a device 190 via a transmission medium 104, which may be of any type desired, such as, for example, a transmission cable, a network, e.g., a local area network (LAN) or wide area network (WAN), such as the Internet, or wireless transmission means, among others.

As shown in FIG. 1, the computer system 82 may include a display device operable to display a graphical user interface for implementing and using embodiments of the present invention. The computer system 82 may include a memory medium(s) on which one or more computer programs or software components according to one embodiment of the present invention may be stored. For example, the memory medium may store one or more programs, e.g., graphical programs, which are executable to perform the methods described herein. Also, the memory medium may store a programming development environment application, e.g., a graphical programming development environment application, used to create and/or execute such programs. For example, in preferred embodiments, the programming development environment may facilitate the development of programs that include performance, timing, and I/O constraint information as part of the program. In other words, a programming language provided by the programming development environment may allow such performance, timing, and I/O constraint specifications or criteria to be included in the program itself, e.g., as part of the source code of the program, and/or may be accessed by the program or tools, e.g., profiling tools, to check the program against the criteria, as will be described in more detail below.

The memory medium may also store operating system software, as well as other software for operation of the computer system. Various embodiments further include receiving or storing instructions and/or data implemented in accordance with the foregoing description upon a computer-accessible medium.

As shown, the device 190 preferably includes a programmable hardware element, such as, for example, an FPGA, which may be configured with a hardware configuration program to implement desired functionality. More specifically, as will be described below in more detail, in some embodiments, the programmable hardware element may be configured to implement a processor, memory, and various other circuit components as desired. In another embodiment, the programmable hardware element may include a processor built directly into the programmable hardware element, e.g., implemented or manufactured as part of the element. In yet another embodiment, the processor may be an external processor coupled or connected to the programmable hardware element. In other words, in some embodiments, the processor and/or memory may actually be components coupled to the programmable hardware element, e.g., the FPGA. In other words, the processor and/or memory may not be implemented by configuring (or manufacturing) the programmable hardware element, but rather, may be standard components used in conjunction with the programmable hardware element. The memory may be operable to store program code, e.g., user code, which may be executed by the processor. As will be discussed in more detail below, in some embodiments, the programmable hardware element may implement, include, or be coupled to various fixed hardware resources, e.g., components, such as, for example, counters, timers, accelerators, I/O components, and so forth, that may be useable by the processor or portions of the programmable hardware element.

The computer 82, e.g., via the programming development environment, may be operable to target, i.e., compile, respective portions of the user code for execution by the processor, and for implementation as hardware on the programmable hardware element, e.g., the FPGA, as needed to meet performance criteria, e.g., resource use, timing, and I/O constraint criteria, and may be further operable to deploy the portions to their respective targets.

The device may be any of a variety of device types, as described below with reference to FIGS. 2A and 2B.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

FIG. 2A illustrates an exemplary instrumentation control system 100 which may implement embodiments of the invention. The system 100 comprises a host computer 82 that connects to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150. According to embodiments of the present invention, one or more of the instruments and devices of FIGS. 2A and 2B may include a programmable hardware element (e.g. an FPGA) configured with a processor and/or memory, and may be further configured with one or more portions of user code, as will be described below in more detail.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
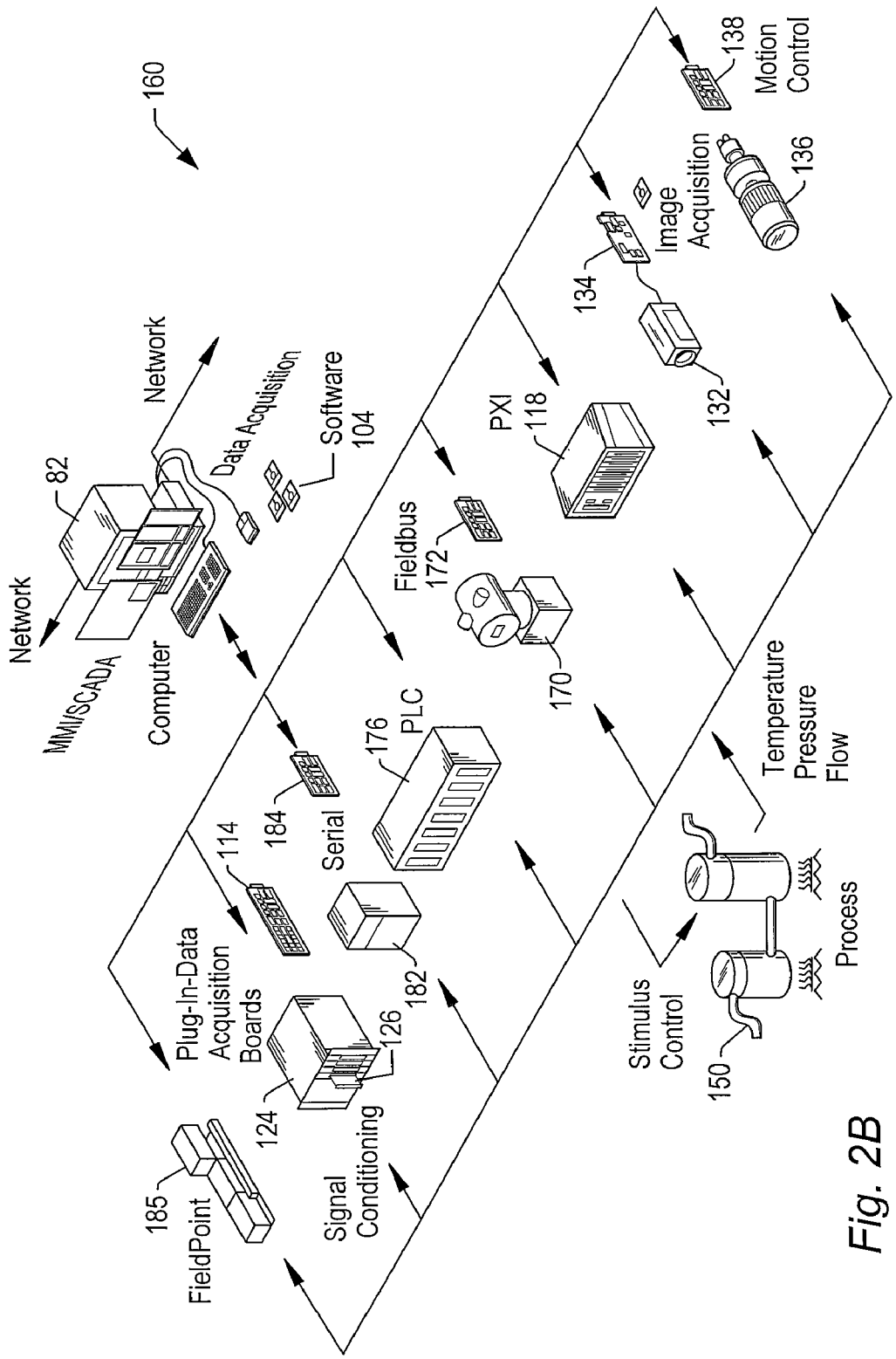
FIG. 2B illustrates an industrial automation system, according to one embodiment of the invention.

FIG. 2B illustrates an exemplary industrial automation system 160 that may implement embodiments of the invention. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 which connects to one or more devices or instruments. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control, among others.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

Figure 3A:
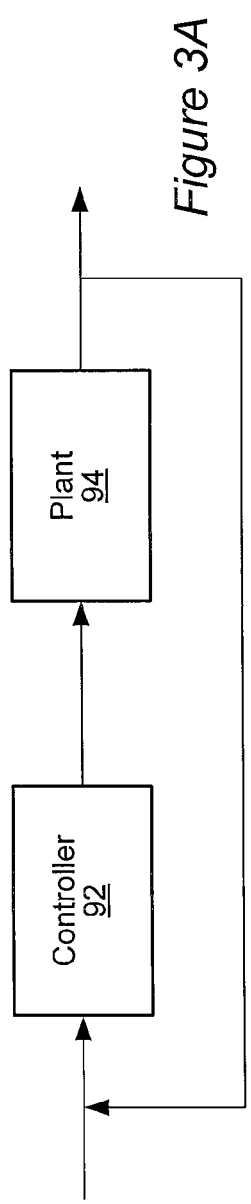
FIG. 3A is a high-level block diagram of an exemplary system that may execute or utilize programs according to some embodiments.

FIG. 3A is a high-level block diagram of an exemplary system that may execute or utilize methods described herein. FIG. 3A illustrates a general high-level block diagram of a generic control and/or simulation system, which comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a graphical program that specifies or implements the functionality of one or both of the controller 92 and the plant 94. For example, a control engineer may use a modeling and simulation tool to create a model (graphical program) of the plant 94 and/or to create the algorithm (graphical program) for the controller 92. According to some embodiments, the controller 92 may include programmable hardware element, such as an FPGA, implementing, including, or coupled to, a processor and/or memory, and further configured with one or more portions of user code.

Figure 3B:
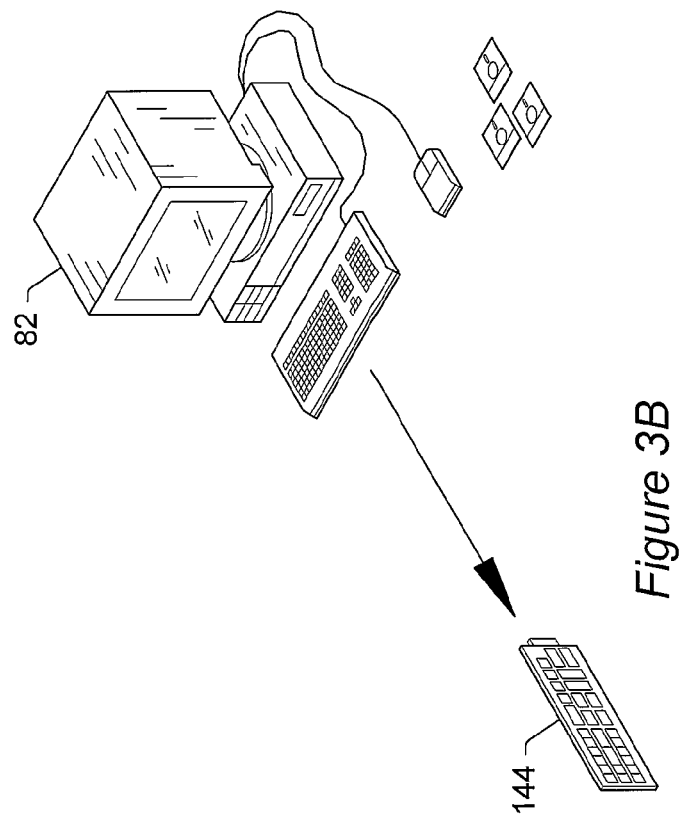
FIG. 3B illustrates an exemplary system that may perform control and/or simulation functions.

FIG. 3B illustrates an exemplary system that may perform control and/or simulation functions. As shown, the controller 92 may be implemented by a computer system 82 or other device (e.g., including a processor and memory medium and/or including a programmable hardware element) that executes or implements a graphical program. In a similar manner, the plant 94 may be implemented by a computer system or other device 144 (e.g., including a processor and memory medium and/or including a programmable hardware element) that executes or implements a graphical program, or may be implemented in or as a real physical system, e.g., a car engine.

In one embodiment of the invention, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real time execution, e.g., a device including a processor that executes a real time operating system (RTOS), or a device including a programmable hardware element.

In one embodiment of the invention, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In one embodiment, the user operates to select a target device from a plurality of possible target devices for programming or configuration using a graphical program. For example, the target devices may each have a programmable hardware element, e.g., an FPGA, or, a device may have multiple programmable hardware elements, e.g., FPGAs, onboard.

Graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 4:
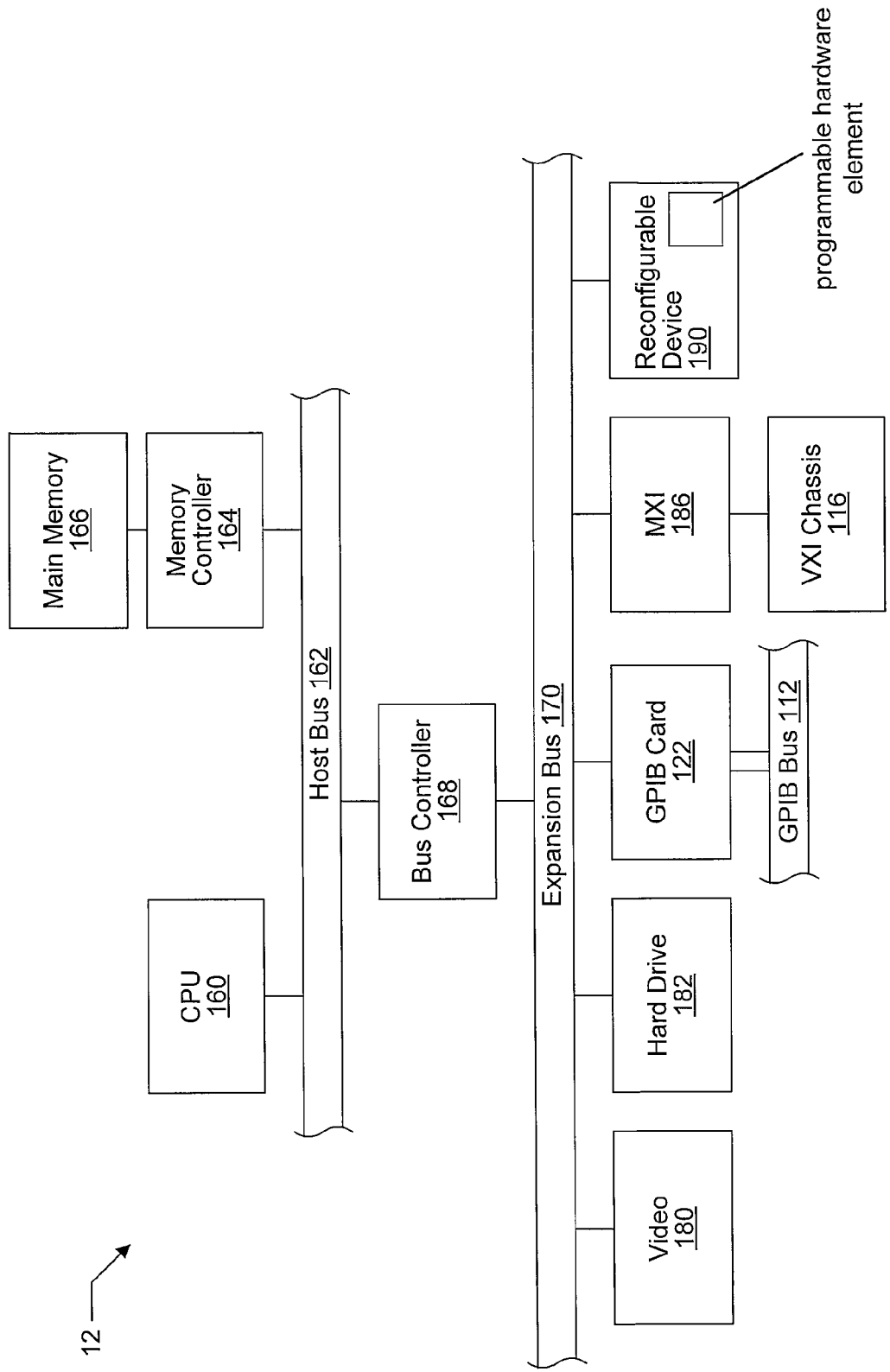
FIG. 4 is an exemplary block diagram of the computer systems of FIGS. 1, 2A, 2B, and 3B.

FIG. 4—Computer System Block Diagram

FIG. 4 is a block diagram representing one embodiment of the computer system 82 and/or 90 illustrated in FIGS. 1A and 1B, or computer system 82 shown in FIG. 2A or 2B. It is noted that any type of computer system configuration or architecture can be used as desired, and FIG. 4 illustrates a representative PC embodiment. It is also noted that the computer system may be a general-purpose computer system, a computer implemented on a card installed in a chassis, or other types of embodiments. Elements of a computer not necessary to understand the present description have been omitted for simplicity.

The computer may include at least one central processing unit or CPU (processor) 160 that is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. As noted above, the main memory 166 may store a programming development environment, e.g., a graphical programming development environment, as well as one or more programs implementing and/or used in embodiments of the present invention. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170.

As shown, a device 190 may also be connected to the computer. The device 190 may include a processor and memory implemented on (e.g., configured on or included in), or coupled to, a programmable hardware element, e.g., an FPGA. The computer system may be operable to deploy a program, e.g., a graphical program, to the device 190 for execution of the program on the device 190, with respective portions of the program possibly implemented on the programmable hardware element, and stored in the memory for execution by the processor.

In some embodiments, the deployed program may take the form of graphical program instructions or data structures that directly represent the program. Alternatively, the deployed program (or a portion of the program) may take the form of text code (e.g., C code) generated from a graphical program. As another example, the deployed program (or a portion of the program) may take the form of compiled code generated from either the graphical program or from text code that in turn was generated from the graphical program.

Figure 5A:
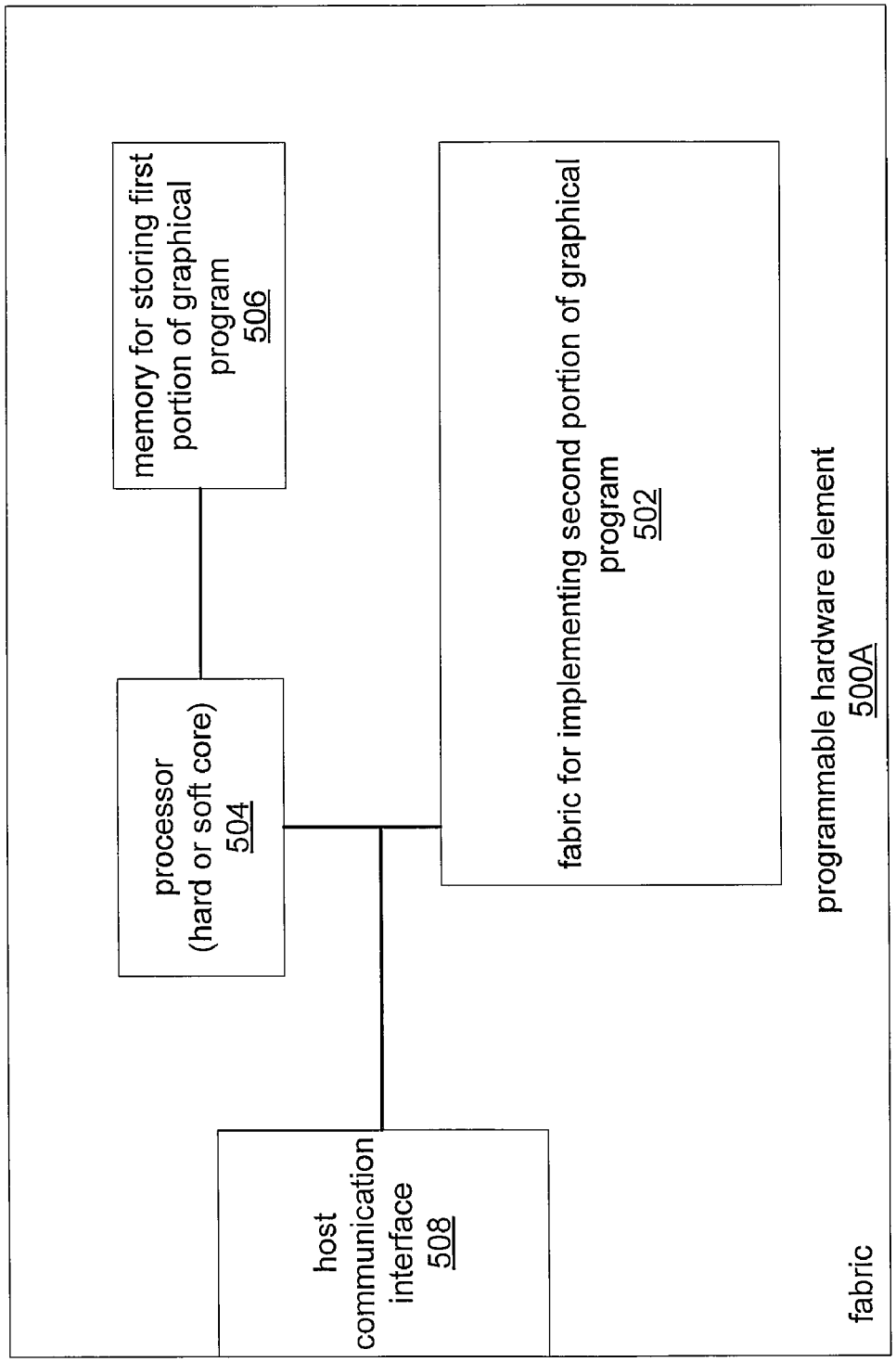
FIG. 5A is a block diagram illustrating a programmable hardware element with an intrinsic processor, according to one embodiment.
Figure 5B:
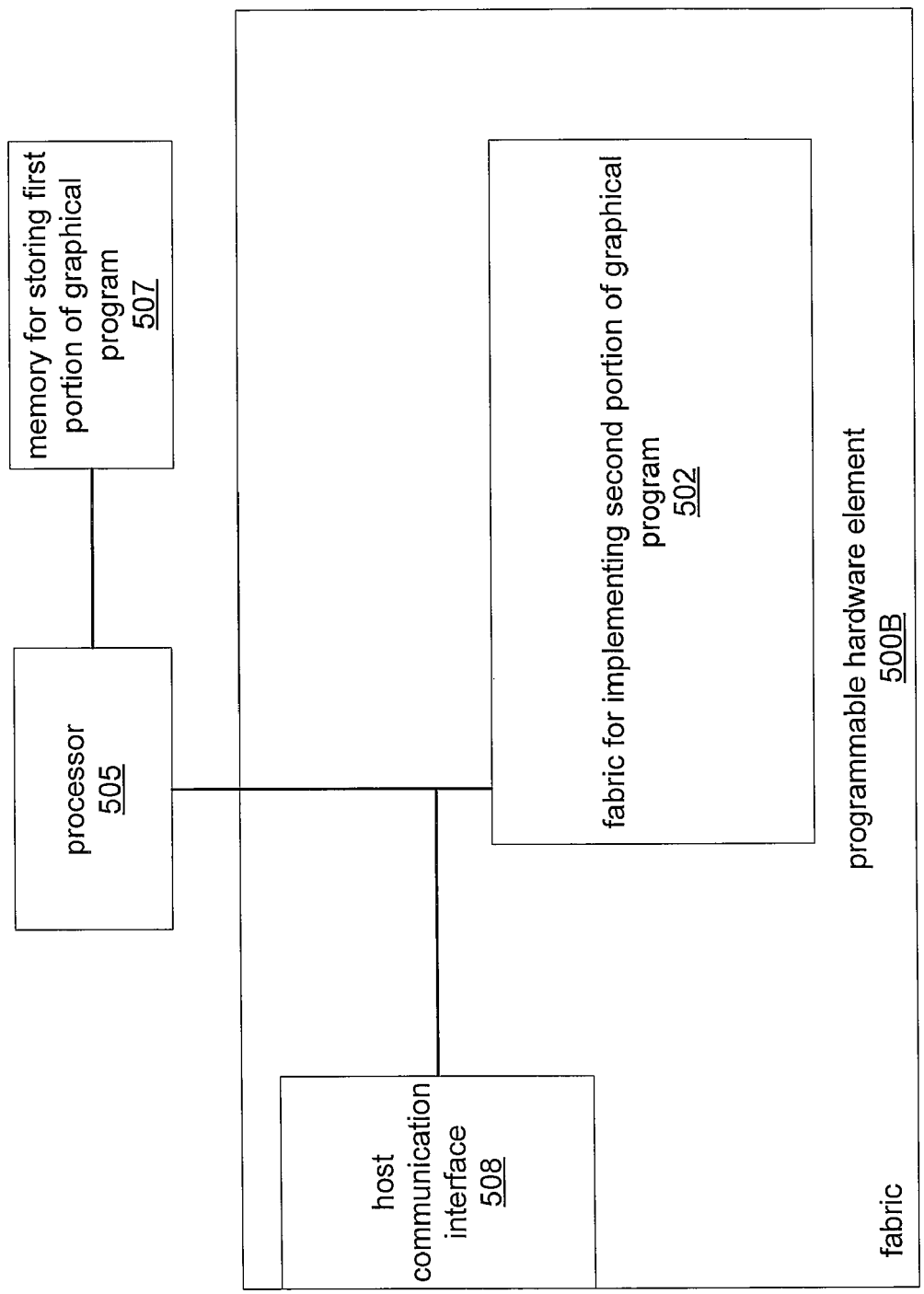
FIG. 5B is a block diagram illustrating a programmable hardware element with an extrinsic processor, according to one embodiment.

FIGS. 5A and 5B—Exemplary Programmable Hardware Elements

FIGS. 5A and 5B are high-level block diagrams illustrating programmable hardware elements, e.g., FPGAs, according to some embodiments. The programmable hardware elements shown may be suitable for use in some embodiments of the present invention. For example, in various embodiments, either these programmable hardware elements may be included in device 190 (see, e.g., FIGS. 1 and 4), e.g., as part of a measurement, control, or automation system, among others. In each programmable hardware element shown (500A in FIG. 5A; 500B in FIG. 5B), the programmable hardware element, as is well known to those of skill in the art of programmable hardware elements such as FPGAs, includes a fabric, e.g., logic gates, via which specified functionality may be implemented in hardware. In each of these approaches, the programmable hardware elements may be suitable for deployment of a graphical program, where the graphical program includes a first portion targeted for execution by a processor implemented in or coupled to the programmable hardware element, and a second portion targeted for implementation in the programmable hardware element, i.e., in the fabric of the programmable hardware element, as will be described below in detail.

As may be seen, FIG. 5A illustrates an embodiment where a processor 504 is intrinsic to the programmable hardware element 500A, i.e., is implemented in the programmable hardware element 500A, e.g., via configuration of the fabric (e.g., the logic gates) of the programmable hardware element, or manufacture, i.e., built directly in and as part of the programmable hardware element. Said another way, in various embodiments of this intrinsic processor conception of the invention, the processor may be implemented as a hard core processor in the programmable hardware element, meaning that the processor is actually built or manufactured directly into the programmable hardware element, or alternatively, may be implemented as a soft core processor in the programmable hardware element, meaning that the programmable hardware element, e.g., the fabric of the element, is configured to implement the processor. As also shown, a memory 506 may be coupled to the processor 504, where the memory may be operable to store a portion, e.g., the first portion, of a graphical program. While the memory 506 is shown implemented in the programmable hardware element, it should be noted that in other embodiments, the memory 506 may be external to the programmable hardware element. As shown, the processor couples to a part of the fabric of the programmable hardware element for implementing the second portion of the graphical program, indicated by 502.

As FIG. 5A also indicates, in some embodiments, the programmable hardware element 500A may also include a host computer interface 508, coupled to the processor 504 and the fabric 502 (for implementing the second portion of the graphical program), where the host computer interface 508 may be operable to facilitate communications between the programmable hardware element and an external host computer, e.g., computer 82. Similar to the memory 504, while the host computer interface 508 is shown implemented in the programmable hardware element, it should be noted that in other embodiments, the host computer interface 508 may be external to the programmable hardware element 500A.

FIG. 5B is directed to embodiments where a processor 505 is extrinsic to a programmable hardware element 500B, i.e., is coupled to the programmable hardware element, e.g., where the processor is external to or not part of the programmable hardware element itself. Similar to the embodiment of FIG. 5A, a memory 507 may be coupled to the processor 505, where the memory may be operable to store the first portion of the graphical program. While the memory 507 is shown external to the programmable hardware element, in other embodiments, the memory 507 may be implemented in the programmable hardware element. As shown, the processor couples to the part of the fabric of the programmable hardware element for implementing the second portion of the graphical program, indicated by 502.

Also similar to the embodiment of FIG. 5A, in some embodiments, the programmable hardware element 500B may also include a host computer interface 508, coupled to the processor 505 and the fabric 502 (for implementing the second portion of the graphical program), where the host computer interface 508 may facilitate communications between the programmable hardware element and an external host computer, e.g., computer 82. As noted above, while the host computer interface 508 is shown implemented in the programmable hardware element, in other embodiments, the host computer interface 508 may be external to the programmable hardware element 500B.

It should be noted that the programmable hardware elements of FIGS. 5A and 5B are meant to be exemplary only, and are not intended to limit the programmable hardware elements to any particular configurations. For example, in some embodiments, discussed elsewhere herein, the programmable hardware element(s) may be coupled to, or implement, additional functional components, such as, for example, counters, timers, accelerators, I/O components, and so forth, that may be useable by the processor or portions of the programmable hardware element.

Graphical Programs and Specifications

As noted above, typical (e.g., text-based) programming languages generally do not support inclusion of performance criteria, e.g., resource usage, timing, and I/O constraint criteria, in the program itself. Rather, in these languages performance criteria, if any, are specified separately from the program. Various tools, e.g., profilers, may then be used to generate performance data for the program, which may then be compared to the performance criteria to determine if the program performance is adequate.

However, some programming languages (and corresponding programming development environments) may support this integration of criteria into the program itself. For example, the graphical programming language "G" used in the LabVIEW graphical program development environment (and its variations) provided by National Instruments Corporation provides such support, where, for convenience, the term "LabVIEW" may be used herein to refer to both.

As one example, LabVIEW provides timed loop structures, which may be included in graphical programs and which may allow a developer to specify execution cycle time constraints for program code included inside the loop. In other words, such timed loops facilitate user-specification in the program of time-constrained loops or iterations. Violations of these execution time constraints may result in an error condition, e.g., which may invoke generation of an error message.

Figure 6:
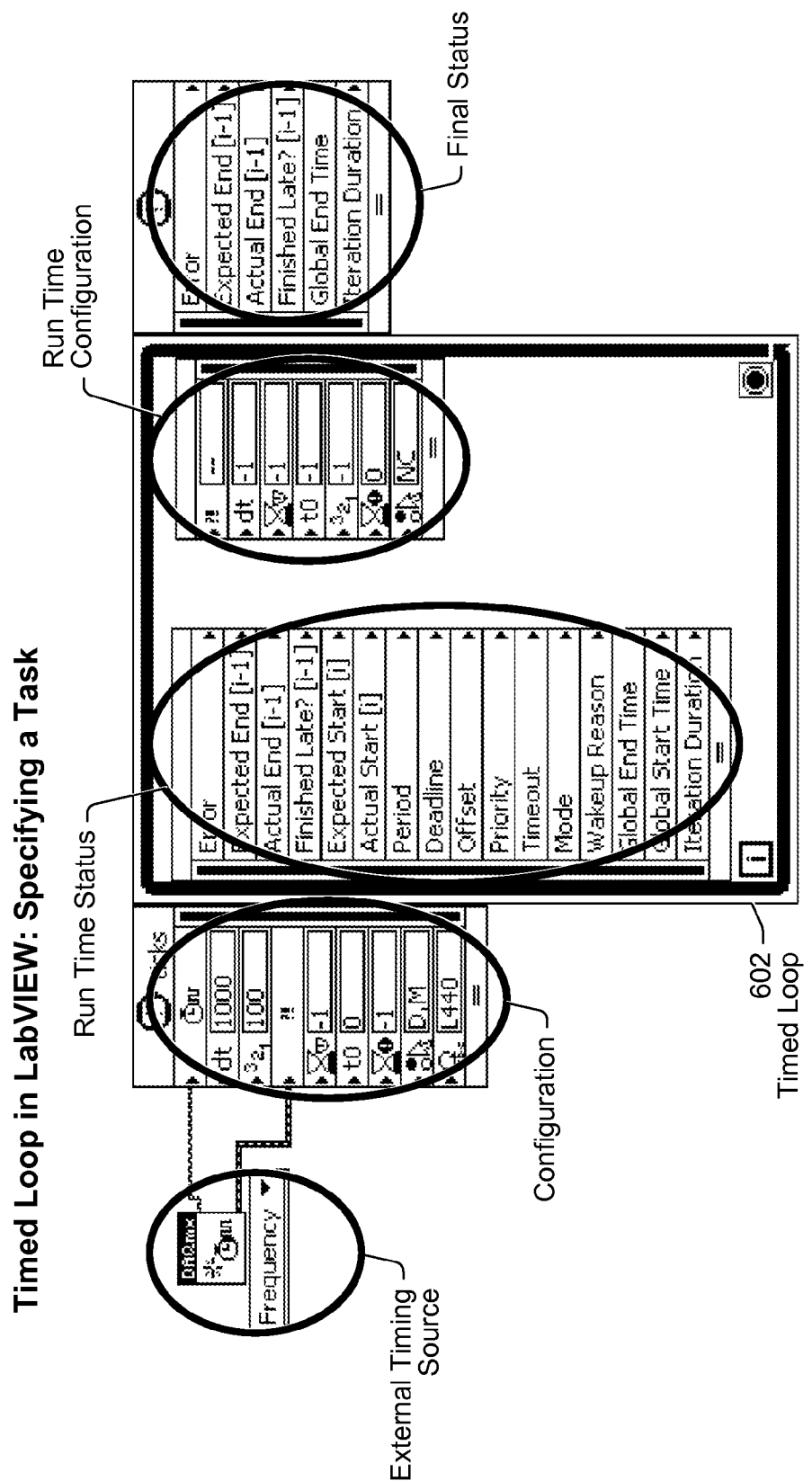
FIG. 6 illustrates an exemplary graphical program timed loop structure that includes performance criteria, according to one embodiment.

The timed loop structure is a configurable while loop that is used to specify and monitor execution parameters and performance of the functionality contained within the timed loop. FIG. 6 illustrates an example of such performance specification or criteria with respect to an exemplary timed loop structure that is presumably included in a graphical program along with various other graphical program nodes or structures. As FIG. 6 shows, timed loop 602 includes means for configuring various attributes of the timed loop specifying task behavior for the timed loop at various points in its operation, including performance criteria, as well as means for indicating status.

As FIG. 6 indicates, in this embodiment, there are four main sections for specifying and monitoring the timed loop, specifically, dropdown attribute menus (or lists) whereby various parameters or attributes of the timed loop may be specified or indicated, here labeled Configuration, Run Time Status, Run Time Configuration, and Final Status. The Configuration section may specify, among other things, performance criteria such as desired rate of execution, desired start time, and execution deadlines. For example, desired rate of execution may be specified in terms of frequency, period, or an external source, and may indicate how often the functionality contained within the timed loop should be executed. As shown, in this embodiment, an external source is being used and is specified by the portion labeled External Timing Source.

As also shown, the Run Time Status may indicate, among other things, the current performance of the timed loop, such as, for example, the actual rate of execution, the actual start time of the timed loop, and whether execution deadlines were met. The Run Time Configuration section may enable the functionality, e.g., graphical program function nodes, contained within the timed loop to modify, among other things, the performance criteria of the timed loop. For example, the functionality contained within the timed loop may dynamically change the desired rate of execution on a per iteration basis. The Final Status section may indicate, among other things, the final performance results for the timed loop, such as, for example, total execution time. Note that the use of constants for specifications (such as a fixed 10 millisecond period for desired rate of execution) may allow the estimation of performance metrics to be performed earlier in the process, such as at edit time. Note furthermore that the run time use of the performance indicators by the functionality contained within the timed loop is optional. In addition, configuration and run time configuration not specified by the code may be automatically assigned default values as appropriate.

It should be noted that the configuration/status menus and their contents are meant to be exemplary only, and that any other configuration/status means may be used as desired. Note also that while FIG. 6 shows all of these different drop-down menus simultaneously, in some embodiments, they may only be invocable singly (one at a time).

Thus, using these and other mechanisms, the graphical program itself may include its own performance criteria, e.g., resource use, timing, and I/O constraint criteria. Additionally, in some embodiments, some of the performance criteria may be specified in other structures or files, e.g., a configuration diagram for the system, in a text file, etc.

Various embodiments of the invention are described below in terms of a graphical program, although it should be noted that any other programming language that supports inclusion of performance criteria, e.g., resource use criteria, timing criteria, and I/O constraint criteria, in programs or at the system level may be used as desired.

Figure 7:
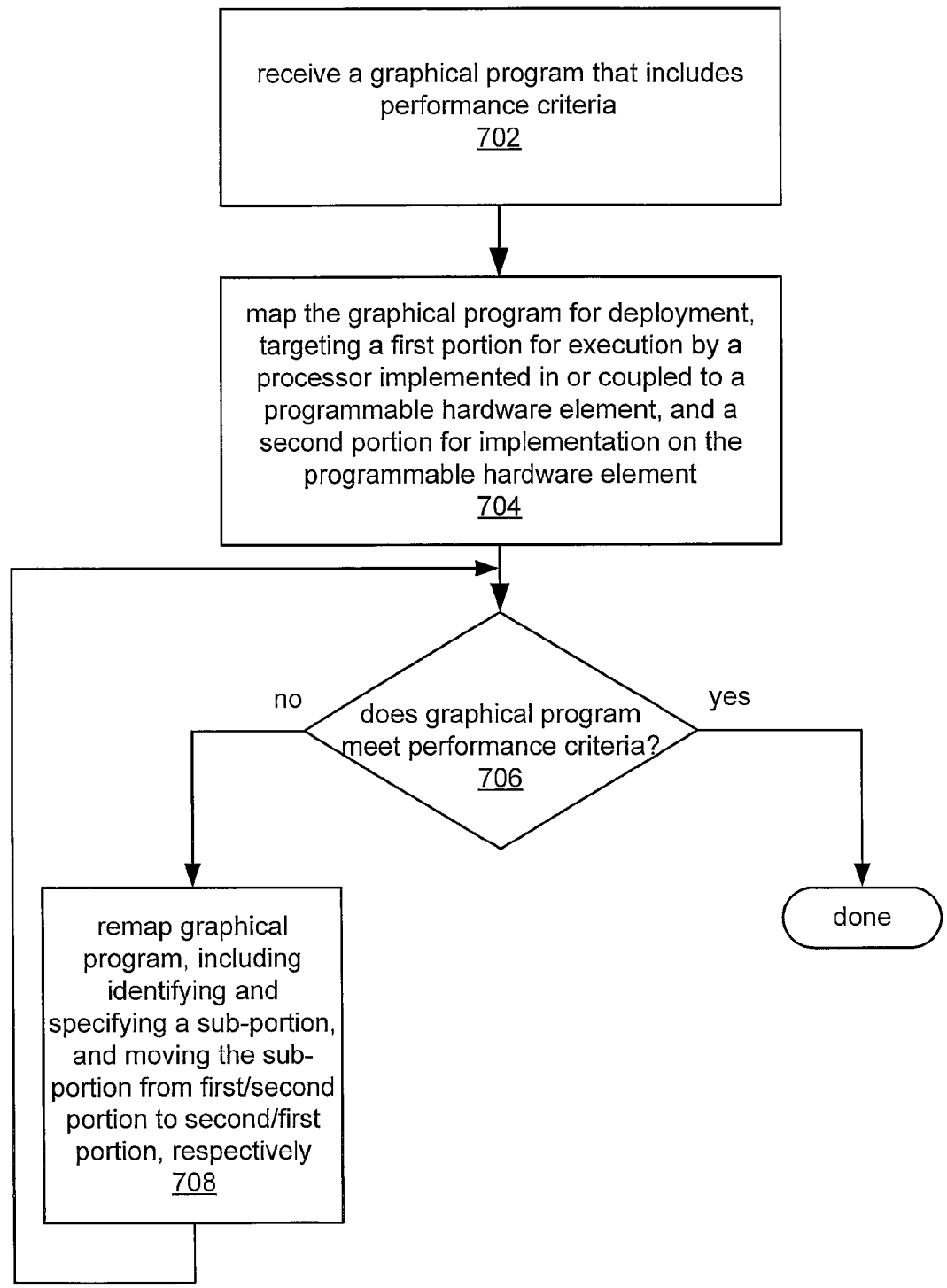
FIG. 7 is a flowchart diagram illustrating one embodiment of a method for implementing a processor centric system design flow.

FIG. 7—Flowchart Diagram

FIG. 7 illustrates a method for implementing a processor centric system design flow, according to various embodiments. The method shown in FIG. 7 may be used in conjunction with any of the computer systems or devices shown in the above-described figures, among other devices. It should be noted that the description below is directed to embodiments of two primary novel conceptions that are similar but distinct; specifically, embodiments where, as described above, the processor is intrinsic to the programmable hardware element, i.e., is implemented in the programmable hardware element, e.g., via configuration of the fabric (e.g., the logic gates) of the programmable hardware element, or manufacture, i.e., built directly in and as part of the programmable hardware element; and embodiments where the processor is extrinsic to the programmable hardware element, i.e., is coupled to the programmable hardware element, e.g., where the processor is external to or not part of the programmable hardware element itself. Note that where the description is applicable to both conceptions, generic language may be used; and that where the two conceptions diverge, distinguishing terminology will be used to indicate the distinctions, e.g., via reference to intrinsic and extrinsic embodiments of the invention.

In various embodiments, some of the method elements shown may be performed concurrently, performed in a different order than shown, or may be omitted. Additional method elements may also be performed as desired. As shown, this method may operate as follows.

First, in 702, a graphical program may be received, e.g., stored in a computer accessible memory medium. In preferred embodiments, the graphical program includes performance criteria, e.g., resource use, timing, and/or I/O constraint information, among others, specifying desired, e.g., minimum, performance characteristics for the graphical program. The graphical program includes a plurality of interconnected nodes that visually indicate functionality of the graphical program, including a first portion targeted for execution by a processor implemented on a programmable hardware element, and a second portion targeted for implementation on the programmable hardware element. Note that in some embodiments, the processor may include multiple processors, and/or the programmable hardware element may include multiple programmable hardware elements, or may include various parts or regions that are managed or targeted separately. Thus, these (first and second) portions may include or be further partitioned into first and/or second sub-portions, respectively, for execution by these processors and for implementation on these parts or regions (e.g., of the programmable hardware element fabric). Thus, for example, in some embodiments, respective sub-portions of the graphical program may be targeted for deployment to an arbitrary number of computing elements, where these computing elements may be processors and/or programmable hardware element parts. Note that in various embodiments, the graphical program may comprise one or more of: a graphical data flow, control flow, and/or execution flow program, or, in one embodiment, a graphical system diagram.

Figure 8A:
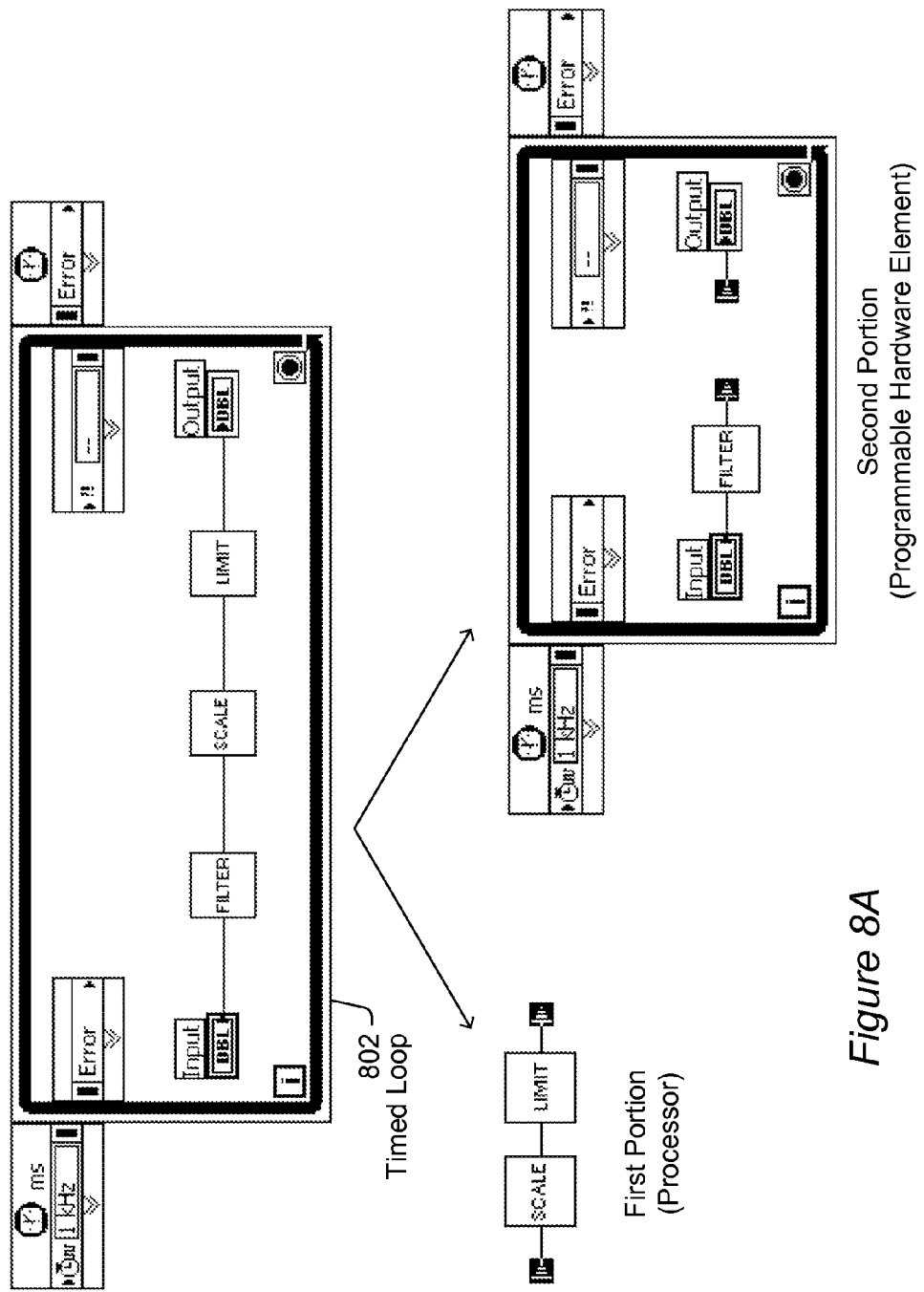

FIG. 8A illustrates an exemplary graphical program shown conceptually partitioned into two portions for respective execution on a processor (first portion) and implementation in or on the fabric of a programmable hardware element (second portion). As may be seen, the graphical program includes a loop structure, e.g., a timed loop, that includes graphical program nodes that, reading from left to right, operate to receive a series of (double) input data, e.g., one value per cycle, filter the data, scale the data, and impose limits on the data, then output the results. Note the left "ear" of the loop, where the cycle frequency for the loop is set to 1 kHz. As FIG. 8A further indicates, in this example, the graphical program has been partitioned (conceptually or logically) into the first portion, comprising the scale and limit function nodes, and the second portion, comprising the remainder of the graphical program, specifically, the loop, I/O, and filter node.

In one embodiment, the method may include receiving user input specifying the graphical program, e.g., on the computer system 82 (or on a different computer system). The graphical program may be created or assembled by the user arranging on a display a plurality of nodes or icons and then interconnecting the nodes to create the graphical program. In response to the user assembling the graphical program, program instructions and/or data structures may be created and stored which represent the graphical program. As noted above, the nodes may be interconnected in one or more of a graphical data flow, control flow, or execution flow format, or, in one embodiment, a graphical system diagram. The graphical program may thus comprise a plurality of interconnected nodes or icons that visually indicates the functionality of the program. In some embodiments, the graphical program may comprise a block diagram and may also include a user interface portion or front panel portion. Where the graphical program includes a user interface portion, the user may optionally assemble the user interface on the display.

As one example, the user may use a graphical system design environment to create the graphical program, such as, for example, the LabVIEW™ graphical program development system provided by National Instruments Corporation, which uses the "G" graphical programming language. For example, a graphical system design environment may include a combination of the LabVIEW, LabVIEW FPGA, and LabVIEW Embedded, which may collectively be capable of targeting different processing engine types found in modern programmable hardware elements, such as fabric, processors, and/or other programmable components). The environment preferably has full parallel semantics, such that, for example, parallel loops in the graphical program may actually specify functionalities that may compete for given resources from the different loops. This resource contention may be taken into account in computing the requirements for implementation in hardware. Note that such graphical tools may offer a much richer set of specification mechanisms than existing text based languages generally do, and therefore may provide the end-user tools necessary to at least partially automate development of a processor centric flow.

It should be noted that source code (of the graphical program) is not restricted to any particular model of computation, such as, for example, the G model of computation, or structural data flow in particular, but may utilize any computational model desired. For example the source code may include a state machine model of computation.

Moreover, in various embodiments, the graphical program may use any of various calling protocols or interfaces, including, for example, one or more of: a host interface call, shared variables (timed or untimed), an asynchronous wire interface, and/or a timing wire interface.

A host interface call refers to a mechanism by which a processor (either intrinsic or extrinsic to the programmable hardware element) communicates with a programmable hardware element by making use of an API similar to those used by an object request broker (ORB). Typically, code executing on the processor opens a reference to the programmable hardware element and methods are provided to read and write special data elements that are implemented as physical registers (or similar functional elements, such as memory) in the programmable hardware element. This mechanism can also be extended to support bidirectional initiation of communication (e.g. interrupt signaling or data transfer via DMA FIFOs (Direct Memory Access First-In First-Out data structures). This mechanism also allows for general-purpose remote method invocation on the programmable hardware element from other processors that may be in the system.

Shared variables are a general mechanism for communicating between two graphically disjoint areas (e.g. two independent loops) regardless of the location of the execution code for each area. For example, when communicating between a host and a real-time device, the shared variable can be defined on the real-time device (e.g., server) while both the host and real-time device can read and/or write to the shared variable (e.g., clients). The access policy may vary between instances of shared variables and between the client accesses. For example, a shared variable could also exist between a processor (either intrinsic or extrinsic to the programmable hardware element) and a programmable hardware element, in which case it would provide an alternate (or parallel) communication mechanism to the host interface presented above.

An asynchronous wire interface can be viewed as a graphical way of specifying and accessing a shared variable. An advantage to using an asynchronous wire is an easy-to-use interface that does not require the specification of a name for the shared variable. As in the case of the shared variable, the asynchronous wire can provide different policies of access for different instances and for its different clients. Note that no specific data flow dependencies are implied, and the asynchronous wires may only define connectivity.

Timing wires are a special type of asynchronous wire that are used to communicate with timing structures and primitives. They primarily define connectivity and policy, and the clocks, triggers, or signals that they correspond to may not follow any specific data flow dependencies, conventions, or protocols.

Figure 9A:
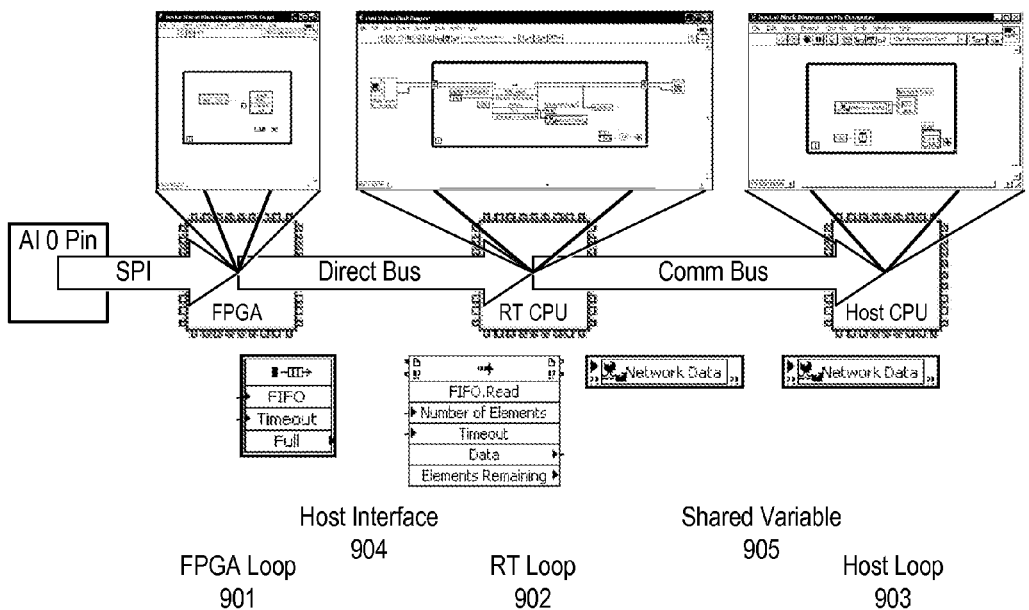
FIGS. 9A and 9B illustrate different calling conventions for use between graphical program portions targeted for execution or implementation on an extrinsic processor, an intrinsic processor, and a programmable hardware element, according to one embodiment.
Figure 9B:
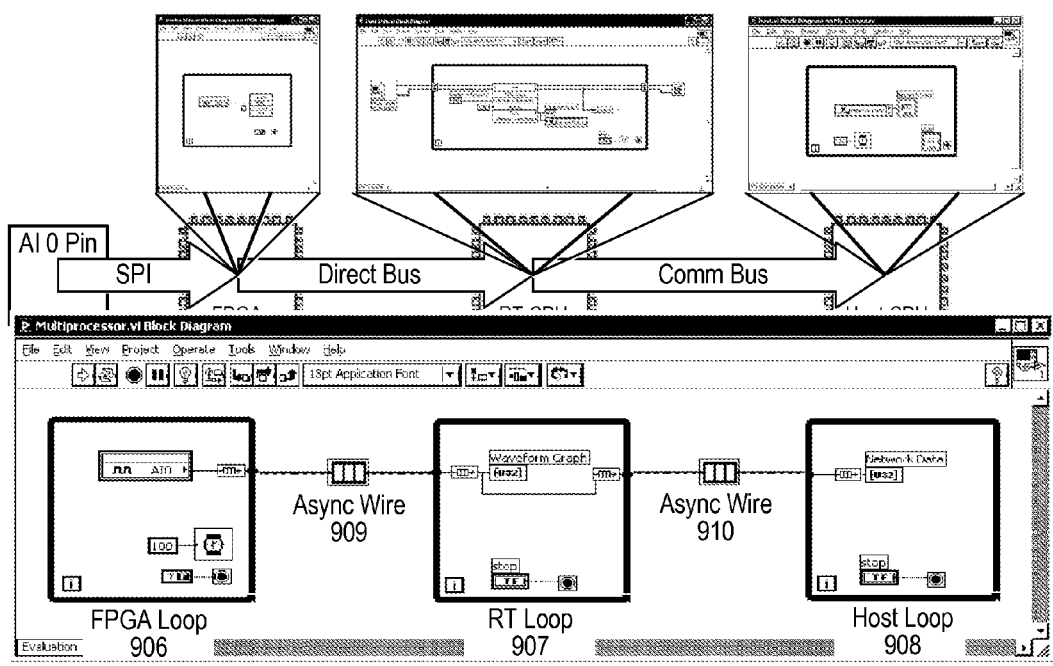

FIGS. 9A and 9B illustrate these different calling conventions. FIG. 9A shows the result of compilation of a system for different types of processing elements, where different portions of a graphical program, specifically, different loops, are targeted for execution or implementation on the different processing elements. As shown, (reading left to right) the different elements include: a programmable hardware element, specifically, an FPGA, so labeled; an intrinsic processor, labeled RT CPU, where RT means real-time, and an extrinsic processor, labeled Host CPU. Note that the FPGA is targeted for deployment of an FPGA loop 901, illustrated above the FPGA in an expansion window; similarly, the intrinsic real-time processor is targeted for execution of a real-time (RT) loop 902, also shown above the intrinsic processor in an expansion window; and the extrinsic (e.g., host) processor is targeted for execution of a host loop 903, also shown above the extrinsic processor.

As also shown, these three elements are connected via two separate buses. The programmable hardware element (FPGA) is connected via a direct bus (e.g. an on-chip Peripheral Local Bus (PLB)) to the real-time processor. Note that both the programmable hardware element and the real-time processor may reside inside the programmable element and may use a host interface type of communication, as indicated by host interface 904, indicated below and between the FPGA and the real-time/intrinsic processor.

Figure 8C:
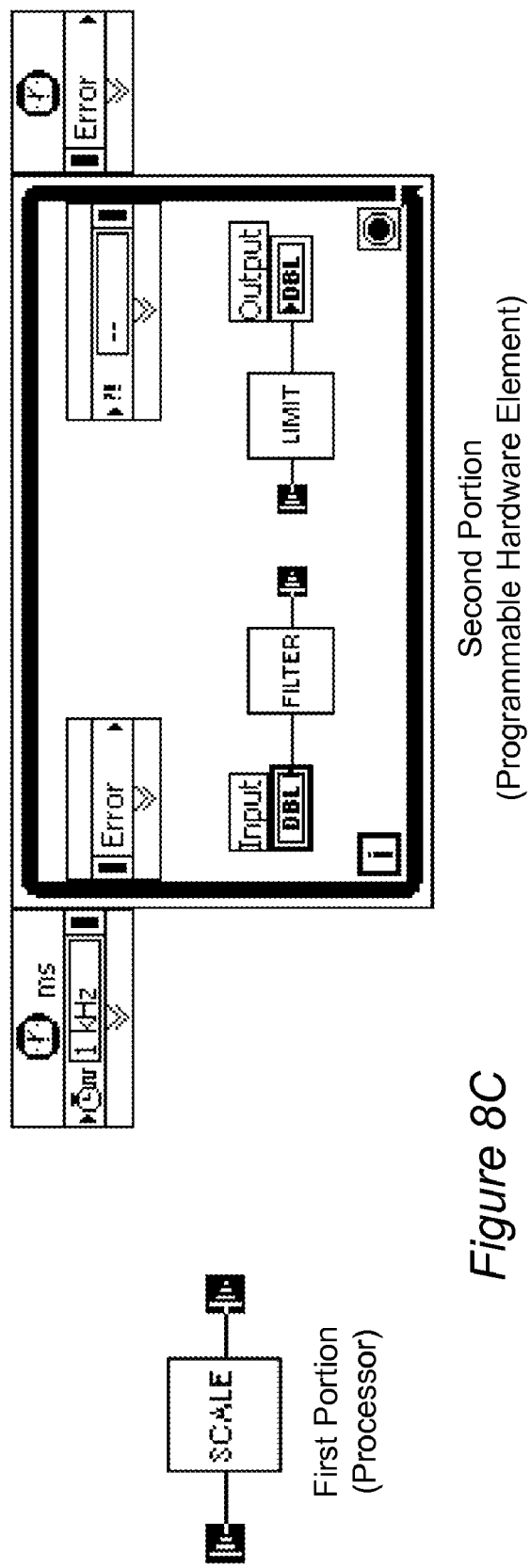

The intrinsic processor and the extrinsic processor are shown connected via a communication bus (e.g. Ethernet), and may use shared variables 905 to communicate. It should be noted that this partitioning of the graphical program or diagram could be the result of the analysis performed on a graphical program or diagram as shown in FIGS. 8A-8C, or could have been directly described, implemented, or specified, by a user or developer in this way.

FIG. 9B shows an embodiment of the system of FIG. 9A, i.e., with an FPGA, intrinsic processor, and extrinsic processor, but where the means of communication of the system of 9A have been replaced with asynchronous (async) wires 909 and 910 to provide a consistent look and feel across the graphical program, regardless of whether the partitioning of the graphical program is the result of an automatic transformation, or specified directly by the user, e.g., the partitioning of the graphical program into the FPGA loop 906, the RT loop 907, and the host loop 908 shown in FIG. 9B.

As FIG. 7 indicates, in 704, the graphical program may be mapped for deployment. As noted above, in embodiments of the first conception of the invention, in such a mapping, a first portion of the graphical program may be targeted for execution by a processor implemented in a programmable hardware element, and a second portion may be targeted for implementation in the programmable hardware element. Thus, as noted above, in embodiments of this first conception, the processor is intrinsic to the programmable hardware element, i.e., via configuration of the programmable hardware element, or by direct manufacture of the processor in the programmable hardware element. FIG. 5A, described above, illustrates one embodiment of the programmable hardware element according to this conception.

Alternatively, in embodiments of the second conception of the invention, in the mapping, the first portion of the graphical program may be targeted for execution by a processor coupled to the programmable hardware element, and the second portion may be targeted for implementation in the programmable hardware element. Thus, as also noted above, in embodiments of this second conception, the processor is extrinsic to the programmable hardware element, i.e., is coupled or connected to the programmable hardware element, rather than being configured in or manufactured as part of the programmable hardware element. FIG. 5B, described above, illustrates one embodiment of the programmable hardware element according to this conception.

It should be noted that in some embodiments, the processor may include multiple processors. For example, the processor may include a central processing unit (CPU), and may also include a floating point unit (FPU), although this is but one of many possible multi-processor embodiments contemplated. Similarly, in some embodiments, the programmable hardware element may include multiple programmable hardware elements, e.g., a plurality of programmable hardware elements may be coupled or joined to conjunctively form the programmable hardware element. In some embodiments, parts of the same physical programmable hardware element may be considered virtual programmable hardware elements, i.e., the programmable hardware element may be logically partitioned among a plurality of virtual programmable hardware elements, where each virtual programmable hardware element may be targeted or managed separately.

As indicated in 706, a determination may be made as to whether the graphical program meets the performance criteria, e.g., the performance, timing, and/or I/O constraints criteria. In other words, a determination may be made as to whether the graphical program meets the performance criteria when executed according to the above mapping, i.e., when executed on the respective targets, i.e., the first portion by the processor and the second portion implemented in the programmable hardware element.

For example, in one embodiment, the graphical program may be profiled, e.g., using a profiler and/or any of various other tools, as desired. Note that in some embodiments, the determining may be performed during edit time of the graphical program, which may facilitate rapid iteration of the system, since the user can simply edit or otherwise modify the graphical program (or portions) directly and easily, e.g., without having to wait for lengthy compile cycles. Alternatively, or in addition, the determining may be performed during compile time, simulation or emulation. In some embodiments, the determining may be performed at run time, e.g., after the graphical program (portions) have been deployed to the programmable hardware element, although this approach may be less efficient than the above approaches. Further details of this determining process are provided below.

If the graphical program meets all the performance criteria, e.g., if the result of the determining, e.g., profiling, etc., proves that the graphical program satisfies the performance criteria, then the development is complete, as FIG. 7 indicates. However, if the performance criteria are not met, the method may proceed to 708, described below.

If in 706, the graphical program is determined to not meet the performance criteria, the graphical program may be remapped for deployment, as indicated in 708. For example, in some embodiments, the remapping may include identifying a sub-portion included in the first portion of the graphical program, and specifying the sub-portion for implementation in the programmable hardware element, thereby moving the sub-portion from the first portion of the graphical program to the second portion of the graphical program, and/or identifying a sub-portion included in the second portion of the graphical program, and specifying the sub-portion for execution on the processor, thereby moving the sub-portion from the second portion of the graphical program to the first portion of the graphical program. In other words, the remapping may identify one or more sub-portions of the first and/or second portions of the graphical program for respective movement to the second and/or first portions of the graphical program, respectively, thereby retargeting the sub-portions for implementation in the programmable hardware element and/or execution by the processor, respectively.

Thus, for example, in a case where a sub-portion of the first portion of the graphical program is identified, e.g., due to slow performance by the processor, the sub-portion may be specified, i.e., re-targeted, for implementation in the programmable hardware element, thereby (presumably) increasing the expected performance of the graphical program. Similarly, in a case where a sub-portion of the second portion of the graphical program is identified, e.g., due to excessive resource use (e.g., too much area of the programmable hardware element being consumed), the sub-portion may be specified, i.e., re-targeted, for execution by the processor, thereby increasing the expected performance of the graphical program (with respect to resource consumption). Note that such retargeting may generally involve some type of tradeoff between different performance metrics, e.g., between execution time performance and resource utilization or area consumption of the programmable hardware element. Thus, in some embodiments, the overall performance criteria may be a complex or compound metric, possibly with competing components.

FIG. 8B illustrates the first and second portions of the exemplary graphical program of FIG. 8A, where a sub-portion of the first portion of the graphical program (targeted for execution by the processor) has been identified, and specified for implementation in the programmable hardware element, specifically, the limit function node, as indicated by the circle around this elements of the program portion. Thus, for example, it may have been determined in 706 above that the graphical program did not meet the specified performance criteria, and that implementing the limit function in hardware (i.e., in the programmable hardware element) would be likely to improve the performance.

FIG. 8C illustrates the updated first and second portions of the graphical program after this remapping. As noted above, such identifying and specifying may move the sub-portion from its original portion of the graphical program, in this particular case, the first portion, to the other portion of the graphical program, in this case, the second portion, as illustrated in FIGS. 8B and 8C. As may be seen, now the limit node is in the second portion of the graphical program (targeted for implementation in the programmable hardware element), while the first portion now only includes the scale function node.

As FIG. 7 illustrates, the determining and remapping may be performed one or more times in an iterative manner, until the performance criteria are met, or until it is determined that the graphical program simply cannot meet the performance criteria, e.g., no matter how the program is partitioned.

It should be noted that the mapping and iteration conditions do not have to be based on full compilations of the program, but may be performed based on high level estimates of performance with respect to the target or targets.

After a number of such iterations (e.g., source code edits and/or redirection of source code for implementation on the programmable hardware element), a hardware-software partition may be found that meets the performance criteria, and that can endure small perturbations of the high-level source code without having to recompile the hardware portions. In other words, further modifications to the graphical program may primarily iterate on the software portions that are substantially faster to compile.

Below are described various further exemplary embodiments of the above method, although it should be noted that the descriptions are not intended to limit the invention to any particular set of attributes or functionality, but rather to give an indication of the breadth and generality of the invention contemplated.

For example, in one embodiment, one or more of the mapping, determining, and/or remapping may be performed automatically without user input, e.g., solely by executed program instructions. In another embodiment, one or more of the mapping, determining, and/or remapping may be performed manually by the user. In a further embodiment, one or more of the mapping, determining, and/or remapping may be performed partially by the user with assistance, e.g., may be performed by a combination of the user and one or more software (or hardware) based tools. In other words, the user may utilize one or more tools to perform one or more of these method elements. For example, a graphical user interface (GUI) may be displayed on a display, where the GUI is operable to guide the user in performing one or more of the mapping, determining, and/or remapping, and where the GUI receives user input to specify at least a portion of one or more of the mapping, determining, and/or remapping. In other words, the GUI may be a "wizard" that leads the user through the process, receiving (and possibly prompting for) various information from the user to perform one or more of these functions.

In a yet further embodiment, one or more of the mapping, determining, and/or remapping may be performed based on user input. For example, the user may interact with the development environment (e.g., executing on computer 82) and/or one or more software tools (e.g., also executing on computer 82), providing user input guiding, informing, and/or specifying one or more of these method elements. For example, the user may invoke one or more tools, e.g., a set or collection of tools, possibly integrated under a common interface, e.g., the development environment, and provide input specifying operation of (at least some of) these functions.

In some embodiments, the mapping and/or remapping the graphical program for deployment may include analyzing functionality of a plurality of preconfigured hardware configuration programs, and determining the second portion of the graphical program based on the analyzing, where at least one of the plurality of preconfigured hardware configuration programs specifies implementation of the second portion of the graphical program. In other words, the mapping and/or remapping may take into account what pre-existing configurations are available for use in implementing the second portion of the graphical program, and so this availability may be used to determine the second portion. Thus, the availability of such preconfigured hardware configuration program, e.g., for commonly used functionality, may have direct bearing on how the graphical program may be partitioned for deployment.

In preferred embodiments, the method may further include generating a hardware configuration program, where the hardware configuration program includes a first portion (of the hardware configuration program) specifying implementation of one or more of: the processor, interface functionality for the processor, and/or one or more components used by the processor to execute the first portion of the graphical program, and a second portion (of the hardware configuration program) specifying remaining configuration of the programmable hardware element. In other words, once the graphical program has been successfully partitioned into the first and second portions, a hardware configuration program may be generated (possibly using one or more pre-existing configurations, as discussed below) that is deployable to the programmable hardware element to implement processor-related functionality (by the first portion of the hardware configuration program), i.e., implementing the processor, interface functionality for the processor, and/or one or more components used by the processor to execute the first portion of the graphical program, and to further configure (by the second portion of the hardware configuration program) the remainder of the programmable hardware element, to implement the second portion of the graphical program (and possibly additional functionality or components useful for performing the functionality of the graphical program, as discussed below). Note that the interface functionality for the processor may be for (the processor) interfacing with other components included on or configured in the programmable hardware element, and/or for interfacing with components or devices external to the programmable hardware element.

In some embodiments, the second portion of the hardware configuration program may only specify functionality matching requirements of the second portion of the graphical program. In other words, the second portion of the hardware configuration program may only implement functionality that precisely (and only) meets the functional requirements of the second portion of the graphical program. Thus, the second portion of the hardware configuration program may be created from scratch, or assembled from one or more pre-existing configurations, to meet (and only meet) these requirements. Note that while this may be an efficient implementation of the functionality (of the second portion of the graphical program), there may be drawbacks to this approach, such as, for example, long compile times in cases where the second portion of the hardware configuration program must be generated and compiled (e.g., from scratch).

Thus, as indicated above, in some embodiments, generating the hardware configuration program may include selecting the hardware configuration program from a set of preconfigured hardware configuration programs, where the second portion of the hardware configuration program meets or exceeds requirements of the second portion of the graphical program. In other words, by relaxing the constraint of only implementing the functionality absolutely required (exactly matching), substantial benefits may accrue. For example, using a pre-existing hardware configuration program that meets the requirements of the second portion of the graphical program, but that also includes some extra functionality that is not needed (and may not be used at all), may obviate such long compilation times. Thus, in some cases, useable space on the fabric of the programmable hardware element may be sacrificed for short(er) development times.

Similarly, in one embodiment, generating the hardware configuration program may include assembling the hardware configuration program from a set of preconfigured sub-configurations, where the second portion of the hardware configuration program meets or exceeds requirements of the second portion of the graphical program. In other words, when some specified functionality of the graphical program is targeted for implementation on the programmable hardware element, rather than creating a hardware configuration program (or a portion of a hardware configuration program) implementing the functionality from scratch, a pre-existing hardware configuration program (or portion), or a plurality of such pre-existing configurations, may be selected from a set or library of such programs, based on analysis of the functionality of the programs, and used to implement this functionality on the programmable hardware element, thus saving substantial development/compile time.

In one embodiment, the hardware configuration program may further specify use of one or more components by the graphical program. For example, the one or more components may include one or more of: one or more accelerators, one or more signal processing functions, one or more timing engines, one or more buffers, one or more counters, one or more timers, and/or one or more I/O interfaces (e.g., Ethernet, etc.), among others. Note that these components may be of any of a variety of types. For example, in various embodiments, the one or more components may include one or more of: one or more fixed hardware resources included in the programmable hardware element, one or more fixed hardware resources coupled to the programmable hardware element, and/or one or more components implemented in the programmable hardware element. Thus, various of the components may be intrinsic to the programmable hardware element (i.e., implemented in the programmable hardware element via configuration, or by manufacture), or extrinsic to the programmable hardware element (i.e., coupled or connected to the programmable hardware element).

Timed Portions

In one embodiment, the graphical program may include a plurality of timed portions, each with a corresponding timing specification and functionality. For example, the plurality of timed portions may include one or more of: one or more timed loops, one or more loop timers, one or more timed sequence structures, one or more wait functions, and/or one or more timing functions, among others. Thus, for example, in one exemplary embodiment, the graphical program may include a set of parallel timed loops with periods and deadlines that provide specific requirements, e.g., for profiling tools that may be used to check the graphical program against the performance criteria. Note that in some embodiments, the profiling may be performed on intermediate forms of the graphical program, such as, for example, textual source code generated from graphical code, as will be discussed in more detail below.

In some embodiments where the graphical program includes a plurality of timed portions (with corresponding timing specifications), determining if the graphical program meets performance criteria may include estimating a performance metric characterizing execution performance of the graphical program (e.g., execution time), and determining a performance deficit based on the performance criteria and the performance metric. Identifying a sub-portion may then include analyzing the timing specification of each of at least a subset of the plurality of timed portions, and selecting at least a part of a timed portion from the subset of the plurality of timed portions as the sub-portion based on the analyzing. Thus, the selecting the at least a part of the timed portion may be based on the performance deficit and the timing specification of the timed portion. In one embodiment, the analyzing and selecting may be performed using one or more heuristics, i.e., using one or more rules derived from empirical data or experience, e.g., from statistics related to past performance of such timed portions, e.g., on processors and/or programmable hardware elements.

Thus, the timing specifications of one or more of the timed portions may be analyzed to determine and select at least a part of a timed portion for retargeting (e.g., from the first portion of the graphical program to the second portion of the graphical program) to at least partially remedy the determined performance deficit of the graphical program.

The estimation of the performance metric may be made in any of a number of ways. For example, estimating the performance metric characterizing execution performance of the graphical program may include estimating the execution time for the first portion of the graphical program, where the estimated performance metric is a function of this estimated execution time. The execution time (for the first portion of the graphical program) may be estimated via any of a variety of ways, including, for example, one or more of: profiling the first portion of the graphical program on the processor to estimate the execution time, timing execution of the first portion of the graphical program on the processor, timing a simulated execution of the first portion of the graphical program on the processor to estimate the execution time, and/or analyzing pre-defined execution time estimates of functional components of the first portion of the graphical to estimate the execution time.

Similarly, estimating the performance metric characterizing execution performance of the graphical program may include estimating an execution time for the second portion of the graphical program, where, similar to above, this estimation of the execution time (for the second portion of the graphical program) may be made via any of a variety of ways, including, for example, one or more of: profiling the second portion of the graphical program with respect to the programmable hardware element to estimate the execution time, timing execution of the second portion of the graphical program on the programmable hardware element to estimate the execution time, timing a simulated execution of the second portion of the graphical program on the programmable hardware element to estimate the execution time, and/or analyzing pre-defined execution time estimates of functional components of the second portion of the graphical program to estimate the execution time. As above, the estimated performance metric may be a function of the estimated execution time for the second portion of the graphical program.

Resource Utilization

As is well known in the art of programmable hardware elements, resource utilization of a programmable hardware element, e.g., an FPGA, may be measured or characterized in terms of area, since the number of individual programmable elements, e.g., logic gates, available or consumed for some specified functionality corresponds to a respective area. Resources may refer to countable objects that are consumed in the process of mapping source code or intermediate code to binary objects, i.e., executable code or hardware configuration, and may include but are not limited to: fabric logic elements, flip-flops and look-up tables, hard multipliers, memory, I/O pins, and processors, among others.

In some embodiments, the graphical program may include a plurality of functional portions, each with a corresponding functionality, and a corresponding area specification with respect to the programmable hardware element. Note that in some embodiments, the area specification may be a function of both the functionality of the functional portion and the logic density of the programmable hardware element.

In one embodiment, determining if the graphical program meets performance criteria may include estimating a performance metric characterizing area utilization of the programmable hardware element by the graphical program, and determining a performance deficit based on the performance criteria and the performance metric. For example, the performance deficit may relate to excessive resource utilization of the programmable hardware element, e.g., reflected in a requirement for area utilization that exceeds the area of the programmable hardware element available for such use. Identifying a sub-portion may thus include analyzing the area specification of each of at least a subset of the plurality of functional portions, and selecting at least a part of a functional portion from the subset of the plurality of functional portions as the sub-portion based on said analyzing. Thus, the selecting the at least a part of the functional portion may be based on the performance deficit and the area specification of the functional portion. As with the timed portion embodiments described above, in one embodiment, the analyzing and selecting may be performed using one or more heuristics, i.e., using one or more rules derived from empirical data or experience, e.g., from statistics related to past performance of such functional portions, e.g., on processors and/or programmable hardware elements.

Thus, the area specifications of one or more of the functional portions may be analyzed to determine and select at least a part of a functional portion for retargeting (e.g., from the second portion of the graphical program to the first portion of the graphical program) to at least partially remedy the determined performance deficit of the graphical program.

The remapping of the sub-portions described above with reference to 708 of FIG. 7 may be performed in any of a variety of ways. For example, in one embodiment, specifying the sub-portion for execution on the processor may include one or more of: tagging graphical source code of the sub-portion for compilation of the graphical source code for the processor, and/or modifying the graphical source code of the sub-portion. For example, tagging graphical source code may include inserting markers, labels, meta-code, etc., into the source code to indicate or specify such targeting of the code for execution by the processor. Modifying the graphical source code of the sub-portion to specify the sub-portion for execution on the processor may include changing the code so as to be recognized by the development environment (or some other tool) for targeting to the processor. For example, in one exemplary case, all for-loops may be pre-specified or targeted for execution on the processor, while all while-loops may be pre-specified or targeted for implementation in the programmable hardware element. Thus, in a situation where a while-loop in the second portion of the graphical program has been identified for movement to the first portion, the while-loop may be changed to a for-loop, and so may subsequently be automatically targeted for execution by the processor.

Similarly, specifying the sub-portion for implementation on the programmable hardware element may include one or more of: tagging graphical source code of the sub-portion for compilation of the graphical source code for implementation in the programmable hardware element, e.g., via insertion of markers, labels, meta-code, etc., into the source code to indicate or specify such targeting of the code for implementation in the programmable hardware element, and/or modifying the graphical source code of the sub-portion, e.g., via the converse of the while-loop/for-loop conversion described above. Note, however, that the while-loop/for-loop example is meant to be exemplary only, and that any other code structure conversions may be used as desired.

In some embodiments, intermediate code may be generated as part of the development of the partitioned program, e.g., based on the graphical program. Note that depending on the particular intermediate code, structures, etc., used, additional code, structure or functionality, e.g., function wrappers, directives, etc., may be added to the system, e.g., to the program, and/or, intermediate code may be generated from one or more portions of the graphical program, which may then be analyzed, profiled, and/or used to generate a hardware configuration file for deployment to the programmable hardware element.

Intermediate code refers to any code that is generated or transformed in the process of obtaining the final available binary code (hardware configuration program) that is implemented and run on the logic gates in a programmable hardware element, sometimes referred to as the fabric, or that is executed by a processor implemented in or coupled to the programmable hardware element. This intermediate code may include graphical and textual code, as the transformation may first happen in the graphical domain, and then may evolve in the textual domain to take advantage of existing text-based programming or analysis tools that some semiconductor vendors make available for their programmable hardware elements. For example, in some embodiments, graphical source code, e.g., G code (the graphical programming language of the LabVIEW graphical programming system), may be converted to C code prior to compiling for the programmable hardware element. The C code may be analyzed with respect to the performance criteria, and may even be altered, e.g., to include special directives specifying the performance criteria, to meet requirements for compilation to a particular programmable hardware element, to include tags specifying one or more portions of the intermediate code for implementation on the programmable hardware element, to optimize the code, to interface with and/or utilize hardware components implemented on, or coupled to, the programmable hardware element, and so forth.

Thus, for example, in some embodiments, the method may include generating intermediate code from the graphical source code, and specifying the sub-portion for execution by the processor may include specifying one or more portions of the intermediate code for execution by the processor. As described above with respect to the graphical source code, specifying one or more portions of the intermediate code for execution by the processor may include one or more of: tagging intermediate source code of the sub-portion for compilation of the intermediate source code for execution by the processor, and/or modifying the intermediate source code of the sub-portion.

Similarly, specifying the sub-portion for implementation on the programmable hardware element may include specifying one or more portions of the intermediate code for implementation on the programmable hardware element, e.g., by tagging intermediate source code of the sub-portion for compilation of the intermediate source code for the programmable hardware element, and/or modifying the intermediate source code of the sub-portion.

Moreover, determining if the graphical program meets performance criteria may include utilizing intermediate source code tools to determine if the intermediate source code meets performance criteria for the graphical program.

It should be noted that the transformation from source code to intermediate code to binary may be performed automatically, semi-automatically, or manually, where automatic transformation is performed completely by the programming environment based on the specification, semi-automatic involves user selection of alternatives presented by the environment, and manual relies purely on end user selection.

In some embodiments, additional measures may be taken to improve the performance of the graphical program. For example, in one embodiment, the method may further include identifying at least a subset of the graphical program for modification, and optimizing the at least a subset of the graphical program. This optimization may be performed in any of a variety of ways. For example, a code optimizer may be utilized to increase performance of the at least a subset of the graphical program, although it should be noted that such optimization may incur certain penalties, e.g., improving the execution time of the code may increase the size of the code, and conversely, decreasing the footprint of the code may increase execution time. In one embodiment, optimizing the at least a subset of the graphical program may include selecting at least one pre-existing code template from a set of pre-existing code templates, where the at least one pre-existing code template implements at least a part of the at least a subset. The pre-existing code templates may be well-understood and precisely characterized with respect to performance, e.g., with respect to execution time and/or footprint, and so may facilitate a more deterministic development process with respect to the performance of the graphical program.

In some embodiments, a given portion (e.g., the first or second portion) or sub-portion of the graphical program may be optimized incrementally, i.e., in steps, e.g., as required by changes in the performance criteria, or as the end user selects alternate transformations to manually meet the performance criteria. For example, in one embodiment, initially, the processor may be modified to include one multiplier, but as the portion or sub-portion is optimized, it may be determined that two or more hardware multipliers or even a multiply-accumulate unit are required. As noted above, in some cases, pre-defined templates may be selected that implement some of these components.

In some embodiments, pre-compiled (for the programmable hardware element) templates, i.e., initial pre-existing configurations, also referred to as "personalities", implementing the processor and/or memory and/or other functionality of the system, may provide a starting point for the development of the system. For example, in one embodiment, the user may select a template implementing the processor and memory, and rudimentary I/O capabilities, and simply provide the user code (i.e., store the user code in the memory) for execution by the processor. As discussed above, in some embodiments, some of the templates may also specify one or more components for use by the graphical program, such as, for example, one or more accelerators, one or more signal processing functions, one or more timing engines, one or more buffers, one or more counters, one or more timers, and/or one or more I/O interfaces (e.g., Ethernet, etc.), among others. Similarly, in some embodiments, templates may be provided that specify use of dedicated hardware units (e.g. processing accelerators, hardware multipliers, dedicated timed I/O units, etc.) that may allow these templates to satisfy a broader set of specifications. In other words, these templates may already include specialized functionality, and may be available for initial selection, e.g., by the user, or by the development environment.

In some embodiments, the method may also include compiling the first portion of the graphical program for execution on the processor, and compiling the second portion of the graphical program for the programmable hardware element. Moreover, in some embodiments, this compiling (e.g., of the first and/or second portions) may be performed one or more times. In other words, in some embodiments, the compilation may be performed in an iterative manner.

As noted above, in some embodiments, the graphical program may be analyzed with respect to at least a portion of the performance criteria at edit time. In other words, in some embodiments, the program may be tested against some of the performance criteria at edit time. If the program fails to meet the performance criteria, the user may edit the program accordingly. Note that the user may iterate such testing/modifying at this level of compilation, which is typically much faster than hardware compilation, i.e., compiling code to a hardware configuration program for deployment to the programmable hardware element, and so may accelerate the development process substantially.

Additionally, or alternatively, in one embodiment, the graphical program may be tested against at least a portion of the performance criteria at compile time. In other words, during, or just after, compilation, the graphical program may be analyzed, e.g., using heuristics, to determine whether the internally encoded performance criteria are met. Thus, the method may include compiling the system for an existing programmable hardware element based processor system. In some embodiments, the graphical program may be compiled for an existing programmable hardware element-based processor system, accessing libraries as needed, e.g., accessing collections of pre-existing configurations or templates, code wrappers, tools, etc., as needed. For example, in one embodiment, at the user's request to "run" the graphical program, the environment may compile the graphical program for an existing programmable hardware element-based processor system, e.g., using a compiler such as, or similar to, the LabVIEW Embedded compiler to generate C code and map the C code to the appropriate tools for software compilation, where, as noted above, various portions of the program may need to be processed by respective tools prior to, or as part of, deployment to the programmable hardware element.

Note that the compilation may be performed by any compilers or tools appropriate, e.g., via a LabVIEW FPGA module (or a similar module), and/or using the LabVIEW Embedded flow, to generate C code, then submitting the C code to a C-to-Gates flow, which may be comprised in the development environment, and which may generate a hardware configuration program for deployment to the programmable hardware element. In various embodiments, these tools may be used separately, conjunctively, and/or in various orders, as desired. Of course, any other tools may be used to compile the system as desired, as indicated above. Thus, the iteration may include compiling the program or portions of the program one or more times, e.g., testing against the performance criteria each time.

As also mentioned above, in some embodiments, the graphical program may be executed in a simulation or emulation, e.g., that models executing the graphical program on the programmable hardware element, where the program tests or checks itself automatically against the performance criteria included therein. In this way, the actual programmable hardware element may not be needed to test the graphical program against the performance criteria. In other embodiments, the graphical program may be deployed to the programmable hardware element and executed (and possibly automatically tested) as part of the development process.

In preferred embodiments, the method may also include deploying the graphical program, including deploying the first portion of the graphical program for execution on the processor, and deploying the second portion of the graphical program to the programmable hardware element, and executing the graphical program, including executing the first portion of the graphical program on the processor, and executing the second portion of the graphical program on the programmable hardware element. In some embodiments, the deploying and/or executing may be performed one or more times. Thus, during performance of the method, the compilation and/or deployment (and possibly execution) may be performed in an iterative manner until the deployed graphical program meets the specified performance criteria.

Thus, once the (partitioned) graphical program meets the performance criteria, the graphical program may be deployed to the programmable hardware element, and the programmable hardware element may be executed, including the processor implemented in or coupled to the programmable hardware element executing the first portion of the graphical program, and executing the second portion of the graphical program implemented on the programmable hardware element.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method, comprising:
    utilizing a computer to perform:
        receiving a graphical program comprising a plurality of interconnected nodes that visually indicate functionality of the graphical program, wherein the graphical program also specifies performance criteria;
        mapping the graphical program for deployment, wherein a first portion of the graphical program is targeted for execution by a processor coupled to a programmable hardware element, and a second portion is targeted for implementation in the programmable hardware element;
        determining if the graphical program meets the performance criteria;
        if the graphical program does not meet the performance criteria, remapping the graphical program for deployment, comprising one or more of:
            identifying a sub-portion comprised in the first portion of the graphical program, and specifying the sub-portion for implementation in the programmable hardware element, thereby moving the sub-portion from the first portion of the graphical program to the second portion of the graphical program; and/or
            identifying a sub-portion comprised in the second portion of the graphical program, and specifying the sub-portion for execution on the processor, thereby moving the sub-portion from the second portion of the graphical program to the first portion of the graphical program; and
        performing said determining and said remapping one or more times in an iterative manner, until the performance criteria are met.

2. The method of claim 1, wherein the processor comprises multiple processors.

3. The method of claim 1, wherein the programmable hardware element comprises multiple programmable hardware elements.

4. The method of claim 1, wherein one or more of said mapping, said determining, and/or said remapping are performed automatically without user input.

5. The method of claim 1, further comprising:
    displaying a graphical user interface (GUI) on a display, wherein the GUI is operable to guide the user in performing one or more of said mapping, said determining, and/or said remapping;
    receiving user input to the GUI to specify at least a portion of one or more of said mapping, said determining, and/or said remapping.

6. The method of claim 1, wherein said mapping and/or said remapping the graphical program for deployment comprises:
    analyzing functionality of a plurality of preconfigured hardware configuration programs; and
    determining the second portion of the graphical program based on said analyzing, wherein at least one of the plurality of preconfigured hardware configuration programs specifies implementation of the second portion of the graphical program.

7. The method of claim 1, further comprising:
    generating a hardware configuration program specifying configuration of the programmable hardware element.

8. The method of claim 7, wherein the hardware configuration program only specifies functionality matching requirements of the second portion of the graphical program.

9. The method of claim 7, wherein said generating the hardware configuration program comprises selecting the hardware configuration program from a set of preconfigured hardware configuration programs, wherein the hardware configuration program meets or exceeds requirements of the second portion of the graphical program.

10. The method of claim 7, wherein said generating the hardware configuration program comprises assembling the hardware configuration program from a set of preconfigured sub-configurations, wherein the hardware configuration program meets or exceeds requirements of the second portion of the graphical program.

11. The method of claim 7, wherein the hardware configuration program further specifies use of one or more components by the graphical program, comprising one or more of:
    one or more accelerators;
    one or more signal processing functions;
    one or more timing engines;
    one or more buffers;
    one or more counters;
    one or more timers; and/or
    one or more I/O interfaces.

12. The method of claim 11, wherein the one or more components comprise one or more of:
    one or more fixed hardware resources included in the programmable hardware element;
    one or more fixed hardware resources coupled to the programmable hardware element; and/or
    one or more components implemented in the programmable hardware element.

13. The method of claim 1, wherein the performance criteria include one or more of:
    timing criteria;
    resource use criteria; and/or
    I/O constraint criteria.

14. The method of claim 1, wherein the performance criteria are further specified in one or more of:
    a configuration diagram for the system; and/or
    a text file.

15. The method of claim 1, wherein said determining is performed during edit time of the graphical program.

16. The method of claim 1, wherein said determining is performed during one or more of:
   compile time of the graphical program;
   simulation or emulation of the graphical program; and/or
   run time of the graphical program.

17. The method of claim 1, wherein the graphical program comprises a plurality of timed portions, each with a corresponding timing specification and functionality.

18. The method of claim 17,
   wherein said determining if the graphical program meets performance criteria comprises:
      estimating a performance metric characterizing execution performance of the graphical program; and
      determining a performance deficit based on the performance criteria and the performance metric; and
   wherein said identifying a sub-portion comprises:
      analyzing the timing specification of each of at least a subset of the plurality of timed portions; and
      selecting at least a part of a timed portion from the subset of the plurality of timed portions as the sub-portion based on said analyzing.

19. The method of claim 18, wherein said estimating a performance metric characterizing execution performance of the graphical program comprises one or more of:
   profiling the first portion of the graphical program on the processor to estimate an execution time for the first portion of the graphical program;
   timing execution of the first portion of the graphical program on the processor to estimate an execution time for the first portion of the graphical program;
   timing a simulated execution of the first portion of the graphical program on the processor to estimate the execution time for the first portion of the graphical program; and/or
   analyzing pre-defined execution time estimates of functional components of the first portion of the graphical program to estimate the execution time for the first portion of the graphical program;
   wherein the estimated performance metric is a function of the estimated execution time for the first portion of the graphical program.

20. The method of claim 18, wherein said estimating a performance metric characterizing execution performance of the graphical program comprises one or more of:
   profiling the second portion of the graphical program with respect to the programmable hardware element to estimate an execution time for the second portion of the graphical program;
   timing execution of the second portion of the graphical program on the programmable hardware element to estimate the execution time for the second portion of the graphical program;
   timing a simulated execution of the second portion of the graphical program on the programmable hardware element to estimate the execution time for the second portion of the graphical program; and/or
   analyzing pre-defined execution time estimates of functional components of the second portion of the graphical program to estimate the execution time for the second portion of the graphical program;
   wherein the estimated performance metric is a function of the estimated execution time for the second portion of the graphical program.

21. The method of claim 18, wherein said selecting comprises:
   selecting the at least a part of the timed portion based on the performance deficit and the timing specification of the timed portion.

22. The method of claim 1, wherein the graphical program comprises a plurality of functional portions, each with a corresponding functionality, and a corresponding area specification with respect to the programmable hardware element;
   wherein said determining if the graphical program meets performance criteria comprises:
      estimating a performance metric characterizing area utilization of the programmable hardware element by the graphical program; and
      determining a performance deficit based on the performance criteria and the performance metric; and
   wherein said identifying a sub-portion comprises:
      analyzing the area specification of each of at least a subset of the plurality of functional portions; and
      selecting at least a part of a functional portion from the subset of the plurality of functional portions as the sub-portion based on said analyzing.

23. The method of claim 1, further comprising:
   identifying at least a subset of the graphical program for modification; and
   optimizing the at least a subset of the graphical program.

24. The method of claim 23, wherein said optimizing the at least a subset of the graphical program comprises:
   selecting at least one pre-existing code template from a set of pre-existing code templates, wherein the at least one pre-existing code template implements at least a part of the at least a subset.

25. The method of claim 1, wherein said specifying the sub-portion for execution on the processor comprises one or more of:
   tagging graphical source code of the sub-portion for compilation of the graphical source code for the processor; and/or
   modifying the graphical source code of the sub-portion.

26. The method of claim 1, further comprising:
   generating intermediate code from the graphical source code;
   wherein said specifying the sub-portion for execution by the processor comprises specifying one or more portions of the intermediate code for execution by the processor.

27. The method of claim 26, wherein said specifying one or more portions of the intermediate code for execution by the processor comprises one or more of:
   tagging intermediate source code of the sub-portion for compilation of the intermediate source code for execution by the processor; and/or
   modifying the intermediate source code of the sub-portion.

28. The method of claim 26, wherein said determining if the graphical program meets performance criteria comprises:
   utilizing intermediate source code tools to determine if the intermediate source code meets performance criteria for the graphical program.

29. The method of claim 1, wherein said specifying the sub-portion for implementation on the programmable hardware element comprises one or more of:
   tagging graphical source code of the sub-portion for implementation in the programmable hardware element; and/or
   modifying the graphical source code of the sub-portion.

30. The method of claim 1, further comprising:
   generating intermediate code from the graphical source code;

wherein said specifying the sub-portion for implementation on the programmable hardware element comprises specifying one or more portions of the intermediate code for implementation on the programmable hardware element.

31. The method of claim 30, wherein said specifying one or more portions of the intermediate code for implementation on the programmable hardware element comprises one or more of:
  tagging intermediate source code of the sub-portion for compilation of the intermediate source code for implementation on the programmable hardware element; and/or
  modifying the intermediate source code of the sub-portion.

32. The method of claim 30, wherein said determining if the graphical program meets performance criteria comprises:
  utilizing intermediate source code tools to determine if the intermediate source code meets performance criteria for the graphical program.

33. The method of claim 1, the method further comprising:
  compiling the first portion of the graphical program for execution on the processor; and
  compiling the second portion of the graphical program for the programmable hardware element;
  wherein said compiling the first portion and/or said compiling the second portion is performed one or more times.

34. The method of claim 1, further comprising:
  deploying the graphical program, including:
    deploying the first portion of the graphical program for execution on the processor; and
    deploying the second portion of the graphical program to the programmable hardware element; and
  executing the graphical program, including:
    the processor executing the first portion of the graphical program; and
    the programmable hardware element performing functionality of the second portion of the graphical program;
  wherein said deploying and/or said executing is performed one or more times.

35. The method of claim 1,
  wherein the graphical program comprises a block diagram portion and a user interface portion, the method further comprising executing the user interface portion on one or more of:
    the processor; and/or
    another processor coupled to the programmable hardware element and/or the processor.

36. The method of claim 1, wherein the graphical program comprises a graphical data flow program, wherein the graphical program comprises a plurality of nodes connected by lines, wherein the lines indicate flow of data between the nodes.

37. The method of claim 1, wherein the graphical program uses one or more of:
  a host interface call;
  one or more shared variables;
  an asynchronous wire interface; and/or
  a timing wire interface.

38. A non-transitory computer-accessible memory medium that stores program instructions, wherein the program instructions are executable by a processor to perform:
  receiving a graphical program comprising a plurality of interconnected nodes that visually indicate functionality of the graphical program, wherein the graphical program also specifies performance criteria;
  mapping the graphical program for deployment, wherein a first portion of the graphical program is targeted for execution by a processor coupled to a programmable hardware element, and a second portion is targeted for implementation in the programmable hardware element;
  determining if the graphical program meets performance criteria;
  if the graphical program does not meet the performance criteria, remapping the graphical program for deployment, comprising one or more of:
    identifying a sub-portion comprised in the first portion of the graphical program, and specifying the sub-portion for implementation in the programmable hardware element, thereby moving the sub-portion from the first portion of the graphical program to the second portion of the graphical program; and/or
    identifying a sub-portion comprised in the second portion of the graphical program, and specifying the sub-portion for execution on the processor, thereby moving the sub-portion from the second portion of the graphical program to the first portion of the graphical program; and
  performing said determining and said remapping one or more times in an iterative manner, until the performance criteria are met.

39. A system, comprising:
  a processor; and
  memory medium coupled to the processor;
  wherein the memory medium stores program instructions that are executable by the processor to:
    receive a graphical program comprising a plurality of interconnected nodes that visually indicate functionality of the graphical program, wherein the graphical program also specifies performance criteria;
    map the graphical program for deployment, wherein a first portion of the graphical program is targeted for execution by a processor coupled to a programmable hardware element, and a second portion is targeted for implementation in the programmable hardware element;
    determine if the graphical program meets the performance criteria;
    if the graphical program does not meet the performance criteria, remap the graphical program for deployment, wherein to remap the graphical program for deployment, the program instructions are executable to:
      identify a sub-portion comprised in the first portion of the graphical program, and specify the sub-portion for implementation in the programmable hardware element, thereby moving the sub-portion from the first portion of the graphical program to the second portion of the graphical program; and/or
      identify a sub-portion comprised in the second portion of the graphical program, and specify the sub-portion for execution on the processor, thereby moving the sub-portion from the second portion of the graphical program to the first portion of the graphical program; and
    perform said determining and said remapping one or more times in an iterative manner, until the performance criteria are met.

* * * * *